(12) United States Patent
Bertness

(10) Patent No.: US 8,958,998 B2
(45) Date of Patent: *Feb. 17, 2015

(54) ELECTRONIC BATTERY TESTER WITH NETWORK COMMUNICATION

(75) Inventor: Kevin I. Bertness, Batavia, IL (US)

(73) Assignee: Midtronics, Inc., Willowbrook, IL (US)

( * ) Notice: Subject to any disclaimer, the term of this patent is extended or adjusted under 35 U.S.C. 154(b) by 313 days.

This patent is subject to a terminal disclaimer.

(21) Appl. No.: 12/758,407

(22) Filed: Apr. 12, 2010

(65) Prior Publication Data

US 2010/0194576 A1   Aug. 5, 2010

Related U.S. Application Data

(60) Continuation-in-part of application No. 11/356,443, filed on Feb. 16, 2006, now abandoned, which is a continuation of application No. 10/914,304, filed on Aug. 9, 2004, now Pat. No. 7,003,411, which is a (Continued)

(51) Int. Cl.
   *G01R 31/36* (2006.01)

(52) U.S. Cl.
   CPC .................... *G01R 31/3627* (2013.01)
   USPC .......................................................... 702/63

(58) Field of Classification Search
   CPC ........................... Y02E 60/12; G01R 31/3627
   USPC ............. 702/63; 701/29, 33.2; 324/426, 427; 320/106; 370/466, 328
   See application file for complete search history.

(56) References Cited

U.S. PATENT DOCUMENTS

| 85,553 A | 1/1869 | Adams ............................ 33/472 |
| 2,000,665 A | 5/1935 | Neal ............................... 439/440 |
| 2,417,940 A | 3/1947 | Lehman ..................... 200/61.25 |
| 2,437,772 A | 3/1948 | Wall ............................... 324/523 |
| 2,514,745 A | 7/1950 | Dalzell .......................... 324/115 |
| 2,727,221 A | 12/1955 | Springg ........................ 340/447 |
| 3,178,686 A | 4/1965 | Mills ............................. 340/447 |
| 3,223,969 A | 12/1965 | Alexander .................... 340/447 |
| 3,267,452 A | 8/1966 | Wolf ............................. 340/249 |
| 3,356,936 A | 12/1967 | Smith ........................... 324/429 |
| 3,562,634 A | 2/1971 | Latner .......................... 324/427 |

(Continued)

FOREIGN PATENT DOCUMENTS

| DE | 29 26 716 B1 | 1/1981 |
| DE | 196 38 324 | 9/1996 |

(Continued)

OTHER PUBLICATIONS

Search Report and Written Opinion from PCT Application No. PCT/US2011/026608, dated Aug. 29, 2011, 9 pgs.

(Continued)

*Primary Examiner* — Tung S Lau
*Assistant Examiner* — Xiuquin Sun
(74) *Attorney, Agent, or Firm* — Westman, Champlin & Koehler, P.A.

(57) ABSTRACT

An electronic battery tester for testing a storage battery includes test circuitry configured to provide a battery test output related to a condition of the battery. A memory stores a battery tester address of the battery tester, and communication circuitry transmits the battery test output formatted with the battery tester address on a communication link to a remote location.

74 Claims, 3 Drawing Sheets

Related U.S. Application Data division of application No. 10/093,853, filed on Mar. 7, 2002, now Pat. No. 6,871,151, which is a continuation-in-part of application No. 10/046,659, filed on Oct. 29, 2001, now Pat. No. 6,909,287, which is a division of application No. 09/564,740, filed on May 4, 2000, now Pat. No. 6,331,762, said application No. 10/046,659 is a continuation-in-part of application No. 09/575,627, filed on May 22, 2000, now Pat. No. 6,313,608, which is a continuation-in-part of application No. 08/962,754, filed on Nov. 3, 1997, now Pat. No. 6,081,098.

(60) Provisional application No. 60/132,622, filed on May 5, 1999, provisional application No. 60/165,208, filed on Nov. 12, 1999, provisional application No. 60/175,762, filed on Jan. 12, 2000.

(56) References Cited

U.S. PATENT DOCUMENTS

| | | | | |
|---|---|---|---|---|
| 3,593,099 | A | 7/1971 | Scholl | 320/127 |
| 3,607,673 | A | 9/1971 | Seyl | 324/425 |
| 3,652,341 | A | 3/1972 | Halsall et al. | 29/623.2 |
| 3,676,770 | A | 7/1972 | Sharaf et al. | 324/430 |
| 3,699,433 | A | 10/1972 | Smith, Jr. | 324/523 |
| 3,729,989 | A | 5/1973 | Little | 73/862.192 |
| 3,750,011 | A | 7/1973 | Kreps | 324/430 |
| 3,753,094 | A | 8/1973 | Furuishi et al. | 324/430 |
| 3,776,177 | A | 12/1973 | Bryant et al. | 116/311 |
| 3,796,124 | A | 3/1974 | Crosa | 411/521 |
| 3,808,522 | A | 4/1974 | Sharaf | 324/430 |
| 3,811,089 | A | 5/1974 | Strzelewicz | 324/170 |
| 3,816,805 | A | 6/1974 | Terry | 320/123 |
| 3,850,490 | A | 11/1974 | Zehr | 439/822 |
| 3,857,082 | A | 12/1974 | Van Opijnen | 320/143 |
| 3,873,911 | A | 3/1975 | Champlin | 324/430 |
| 3,876,931 | A | 4/1975 | Godshalk | 324/429 |
| 3,886,426 | A | 5/1975 | Daggett | 320/117 |
| 3,886,443 | A | 5/1975 | Miyakawa et al. | 324/426 |
| 3,889,248 | A | 6/1975 | Ritter | 340/636.11 |
| 3,906,329 | A | 9/1975 | Bader | 320/134 |
| 3,909,708 | A | 9/1975 | Champlin | 324/431 |
| 3,920,284 | A | 11/1975 | Lane et al. | 303/122.06 |
| 3,936,744 | A | 2/1976 | Perlmutter | 324/772 |
| 3,946,299 | A | 3/1976 | Christianson et al. | 320/430 |
| 3,947,757 | A | 3/1976 | Grube et al. | 324/416 |
| 3,969,667 | A | 7/1976 | McWilliams | 324/427 |
| 3,979,664 | A | 9/1976 | Harris | 324/397 |
| 3,984,762 | A | 10/1976 | Dowgiallo, Jr. | 324/430 |
| 3,984,768 | A | 10/1976 | Staples | 324/712 |
| 3,989,544 | A | 11/1976 | Santo | 429/65 |
| 3,997,830 | A | 12/1976 | Newell et al. | 320/102 |
| 4,008,619 | A | 2/1977 | Alcaide et al. | 73/724 |
| 4,023,882 | A | 5/1977 | Pettersson | 439/426 |
| 4,024,953 | A | 5/1977 | Nailor, III | 206/334 |
| 4,047,091 | A | 9/1977 | Hutchines et al. | 363/59 |
| 4,053,824 | A | 10/1977 | Dupuis et al. | 324/434 |
| 4,056,764 | A | 11/1977 | Endo et al. | 320/101 |
| 4,057,313 | A | 11/1977 | Polizzano | 439/219 |
| 4,070,624 | A | 1/1978 | Taylor | 324/772 |
| 4,086,531 | A | 4/1978 | Bernier | 324/772 |
| 4,106,025 | A | 8/1978 | Katz | 343/715 |
| 4,112,351 | A | 9/1978 | Back et al. | 324/380 |
| 4,114,083 | A | 9/1978 | Benham et al. | 340/636.13 |
| 4,126,874 | A | 11/1978 | Suzuki et al. | 396/301 |
| 4,160,916 | A | 7/1979 | Papasideris | 307/10.6 |
| 4,178,546 | A | 12/1979 | Hulls et al. | 324/772 |
| 4,193,025 | A | 3/1980 | Frailing et al. | 324/427 |
| 4,207,610 | A | 6/1980 | Gordon | 701/33.9 |
| 4,207,611 | A | 6/1980 | Gordon | 701/33 |
| 4,217,645 | A | 8/1980 | Barry et al. | 702/63 |
| 4,218,745 | A | 8/1980 | Perkins | 324/66 |
| 4,280,457 | A | 7/1981 | Bloxham | 123/198 R |
| 4,297,639 | A | 10/1981 | Branham | 324/429 |
| 4,307,342 | A | 12/1981 | Peterson | 324/767 |
| 4,315,204 | A | 2/1982 | Sievers et al. | 322/28 |
| 4,316,185 | A | 2/1982 | Watrous et al. | 340/636.11 |
| 4,322,685 | A | 3/1982 | Frailing et al. | 324/429 |
| 4,351,405 | A | 9/1982 | Fields et al. | 180/65.2 |
| 4,352,067 | A | 9/1982 | Ottone | 324/434 |
| 4,360,780 | A | 11/1982 | Skutch, Jr. | 324/437 |
| 4,361,809 | A | 11/1982 | Bil et al. | 324/426 |
| 4,363,407 | A | 12/1982 | Buckler et al. | 209/3.3 |
| 4,369,407 | A | 1/1983 | Korbell | 324/416 |
| 4,379,989 | A | 4/1983 | Kurz et al. | 320/165 |
| 4,379,990 | A | 4/1983 | Sievers et al. | 322/99 |
| 4,385,269 | A | 5/1983 | Aspinwall et al. | 320/129 |
| 4,390,828 | A | 6/1983 | Converse et al. | 320/153 |
| 4,392,101 | A | 7/1983 | Saar et al. | 320/156 |
| 4,396,880 | A | 8/1983 | Windebank | 320/156 |
| 4,408,157 | A | 10/1983 | Beaubien | 324/712 |
| 4,412,169 | A | 10/1983 | Dell'Orto | 320/123 |
| 4,423,378 | A * | 12/1983 | Marino et al. | 324/427 |
| 4,423,379 | A | 12/1983 | Jacobs et al. | 324/429 |
| 4,424,491 | A | 1/1984 | Bobbett et al. | 324/433 |
| 4,441,359 | A | 4/1984 | Ezoe | 73/116.06 |
| 4,459,548 | A | 7/1984 | Lentz et al. | 324/472 |
| 4,514,694 | A | 4/1985 | Finger | 324/429 |
| 4,520,353 | A | 5/1985 | McAuliffe | 340/636.16 |
| 4,521,498 | A | 6/1985 | Juergens | 429/59 |
| 4,564,798 | A | 1/1986 | Young | 320/103 |
| 4,620,767 | A | 11/1986 | Woolf | 439/217 |
| 4,633,418 | A | 12/1986 | Bishop | 702/63 |
| 4,637,359 | A | 1/1987 | Cook | 123/179 |
| 4,659,977 | A | 4/1987 | Kissel et al. | 320/150 |
| 4,663,580 | A | 5/1987 | Wortman | 320/153 |
| 4,665,370 | A | 5/1987 | Holland | 324/429 |
| 4,667,143 | A | 5/1987 | Cooper et al. | 320/153 |
| 4,667,279 | A | 5/1987 | Maier | 363/46 |
| 4,678,998 | A | 7/1987 | Muramatsu | 324/427 |
| 4,679,000 | A | 7/1987 | Clark | 324/428 |
| 4,680,528 | A | 7/1987 | Mikami et al. | 320/165 |
| 4,686,442 | A | 8/1987 | Radomski | 320/123 |
| 4,697,134 | A | 9/1987 | Burkum et al. | 320/134 |
| 4,707,795 | A | 11/1987 | Alber et al. | 702/63 |
| 4,709,202 | A | 11/1987 | Koenck et al. | 320/112 |
| 4,710,861 | A | 12/1987 | Kanner | 363/46 |
| 4,719,428 | A | 1/1988 | Liebermann | 324/436 |
| 4,723,656 | A | 2/1988 | Kiernan et al. | 206/705 |
| 4,743,855 | A | 5/1988 | Randin et al. | 324/430 |
| 4,745,349 | A | 5/1988 | Palanisamy et al. | 320/125 |
| 4,773,011 | A | 9/1988 | VanHoose | 701/30 |
| 4,781,629 | A | 11/1988 | Mize | 439/822 |
| D299,909 | S | 2/1989 | Casey | D10/77 |
| 4,816,768 | A | 3/1989 | Champlin | 324/428 |
| 4,820,966 | A | 4/1989 | Fridman | 320/116 |
| 4,825,170 | A | 4/1989 | Champlin | 324/436 |
| 4,847,547 | A | 7/1989 | Eng, Jr. et al. | 320/153 |
| 4,849,700 | A | 7/1989 | Morioka et al. | 324/427 |
| 4,874,679 | A | 10/1989 | Miyagawa | 429/91 |
| 4,876,495 | A | 10/1989 | Palanisamy et al. | 320/106 |
| 4,881,038 | A | 11/1989 | Champlin | 324/426 |
| 4,885,523 | A | 12/1989 | Koench | 230/131 |
| 4,888,716 | A | 12/1989 | Ueno | 702/63 |
| 4,901,007 | A | 2/1990 | Sworm | 324/110 |
| 4,907,176 | A | 3/1990 | Bahnick et al. | 364/551.01 |
| 4,912,416 | A | 3/1990 | Champlin | 324/430 |
| 4,913,116 | A | 4/1990 | Katogi et al. | 123/406.32 |
| 4,926,330 | A | 5/1990 | Abe et al. | 701/33 |
| 4,929,931 | A | 5/1990 | McCuen | 340/636.15 |
| 4,931,738 | A | 6/1990 | MacIntyre et al. | 324/435 |
| 4,932,905 | A | 6/1990 | Richards | 439/822 |
| 4,933,845 | A | 6/1990 | Hayes | 710/104 |
| 4,934,957 | A | 6/1990 | Bellusci | 439/504 |
| 4,937,528 | A | 6/1990 | Palanisamy | 324/430 |
| 4,947,124 | A | 8/1990 | Hauser | 324/430 |
| 4,949,046 | A | 8/1990 | Seyfang | 324/427 |
| 4,956,597 | A | 9/1990 | Heavey et al. | 320/129 |
| 4,965,738 | A | 10/1990 | Bauer et al. | 320/136 |
| 4,968,941 | A | 11/1990 | Rogers | 324/428 |
| 4,968,942 | A | 11/1990 | Palanisamy | 324/430 |
| 4,969,834 | A | 11/1990 | Johnson | 439/141 |
| 4,983,086 | A | 1/1991 | Hatrock | 411/259 |

(56) References Cited

U.S. PATENT DOCUMENTS

| | | | | |
|---|---|---|---|---|
| 5,004,979 | A | 4/1991 | Marino et al. | 324/160 |
| 5,030,916 | A | 7/1991 | Bokitch | 324/503 |
| 5,032,825 | A | 7/1991 | Kuznicki | 340/636.15 |
| 5,034,893 | A | 7/1991 | Fisher | 701/99 |
| 5,037,778 | A | 8/1991 | Stark et al. | 228/121 |
| 5,047,722 | A | 9/1991 | Wurst et al. | 324/430 |
| 5,081,565 | A | 1/1992 | Nabha et al. | 362/465 |
| 5,087,881 | A | 2/1992 | Peacock | 324/378 |
| 5,095,223 | A | 3/1992 | Thomas | 307/110 |
| 5,108,320 | A | 4/1992 | Kimber | 439/883 |
| 5,109,213 | A | 4/1992 | Williams | 340/447 |
| 5,126,675 | A | 6/1992 | Yang | 324/435 |
| 5,130,658 | A | 7/1992 | Bohmer | 324/435 |
| 5,140,269 | A | 8/1992 | Champlin | 324/433 |
| 5,144,218 | A | 9/1992 | Bosscha | 320/139 |
| 5,144,248 | A | 9/1992 | Alexandres et al. | 324/428 |
| D330,338 | S | 10/1992 | Wang | D10/77 |
| 5,159,272 | A | 10/1992 | Rao et al. | 324/429 |
| 5,160,881 | A | 11/1992 | Schramm et al. | 322/7 |
| 5,164,653 | A | 11/1992 | Reem | |
| 5,168,208 | A | 12/1992 | Schultz et al. | 322/25 |
| 5,170,124 | A | 12/1992 | Blair et al. | 324/434 |
| 5,179,335 | A | 1/1993 | Nor | 320/159 |
| 5,187,382 | A | 2/1993 | Kondo | 307/10.1 |
| 5,194,799 | A | 3/1993 | Tomantschger | 320/103 |
| 5,204,611 | A | 4/1993 | Nor et al. | 320/145 |
| 5,214,370 | A | 5/1993 | Harm et al. | 320/152 |
| 5,214,385 | A | 5/1993 | Gabriel et al. | 324/434 |
| 5,241,275 | A | 8/1993 | Fang | 324/430 |
| 5,254,952 | A | 10/1993 | Salley et al. | 324/429 |
| 5,266,880 | A | 11/1993 | Newland | 320/125 |
| 5,278,759 | A | 1/1994 | Berra et al. | 701/1 |
| 5,281,919 | A | 1/1994 | Palanisamy | 324/427 |
| 5,281,920 | A | 1/1994 | Wurst | 324/430 |
| 5,295,078 | A | 3/1994 | Stich et al. | 700/297 |
| 5,298,797 | A | 3/1994 | Redl | 327/387 |
| 5,300,874 | A | 4/1994 | Shimamoto et al. | 320/106 |
| 5,302,902 | A | 4/1994 | Groehl | 324/434 |
| 5,313,152 | A | 5/1994 | Wozniak et al. | 320/118 |
| 5,315,287 | A | 5/1994 | Sol | 340/455 |
| 5,321,626 | A | 6/1994 | Palladino | 702/63 |
| 5,321,627 | A | 6/1994 | Reher | 702/63 |
| 5,323,337 | A | 6/1994 | Wilson et al. | 702/73 |
| 5,325,041 | A | 6/1994 | Briggs | 320/149 |
| 5,331,268 | A | 7/1994 | Patino et al. | 320/151 |
| 5,332,927 | A | 7/1994 | Paul et al. | 307/66 |
| 5,336,993 | A | 8/1994 | Thomas et al. | 324/158.1 |
| 5,338,515 | A | 8/1994 | Dalla Betta et al. | 422/95 |
| 5,339,018 | A | 8/1994 | Brokaw | 320/147 |
| 5,343,380 | A | 8/1994 | Champlin | 363/46 |
| 5,345,384 | A | 9/1994 | Przybyla et al. | 701/29.1 |
| 5,347,163 | A | 9/1994 | Yoshimura | 307/66 |
| 5,352,968 | A | 10/1994 | Reni et al. | 320/136 |
| 5,357,519 | A | 10/1994 | Martin et al. | 371/15.1 |
| 5,365,160 | A | 11/1994 | Leppo et al. | 320/160 |
| 5,365,453 | A | 11/1994 | Startup et al. | 702/36 |
| 5,369,364 | A | 11/1994 | Renirie et al. | 324/430 |
| 5,381,096 | A | 1/1995 | Hirzel | 324/427 |
| 5,384,540 | A | 1/1995 | Dessel | 324/539 |
| 5,387,871 | A | 2/1995 | Tsai | 324/429 |
| 5,394,093 | A | 2/1995 | Cervas | 324/556 |
| 5,402,007 | A | 3/1995 | Center et al. | 290/40 B |
| 5,410,754 | A * | 4/1995 | Klotzbach et al. | 370/466 |
| 5,412,308 | A | 5/1995 | Brown | 323/267 |
| 5,412,323 | A | 5/1995 | Kato et al. | 324/429 |
| 5,425,041 | A | 6/1995 | Seko et al. | 372/45.01 |
| 5,426,371 | A | 6/1995 | Salley et al. | 324/429 |
| 5,426,416 | A | 6/1995 | Jefferies et al. | 340/664 |
| 5,430,645 | A | 7/1995 | Keller | 364/424.01 |
| 5,432,025 | A | 7/1995 | Cox | 29/65 |
| 5,432,426 | A | 7/1995 | Yoshida | 320/160 |
| 5,434,495 | A | 7/1995 | Toko | 320/135 |
| 5,435,185 | A | 7/1995 | Eagan | 73/587 |
| 5,442,274 | A | 8/1995 | Tamai | 320/146 |
| 5,445,026 | A | 8/1995 | Eagan | 73/591 |
| 5,449,996 | A | 9/1995 | Matsumoto et al. | 320/148 |
| 5,449,997 | A | 9/1995 | Gilmore et al. | 320/148 |
| 5,451,881 | A | 9/1995 | Finger | 324/433 |
| 5,453,027 | A | 9/1995 | Buell et al. | 439/433 |
| 5,457,377 | A | 10/1995 | Jonsson | 324/430 |
| 5,459,660 | A | 10/1995 | Berra | 701/33 |
| 5,469,043 | A | 11/1995 | Cherng et al. | 320/161 |
| 5,485,090 | A | 1/1996 | Stephens | 324/433 |
| 5,488,300 | A | 1/1996 | Jamieson | 324/432 |
| 5,504,674 | A | 4/1996 | Chen et al. | 705/4 |
| 5,508,599 | A | 4/1996 | Koenck | 320/138 |
| 5,519,383 | A | 5/1996 | De La Rosa | 340/636.15 |
| 5,528,148 | A | 6/1996 | Rogers | 320/137 |
| 5,537,967 | A | 7/1996 | Tashiro et al. | 123/192.1 |
| 5,541,489 | A | 7/1996 | Dunstan | 320/134 |
| 5,546,317 | A | 8/1996 | Andrieu | 702/63 |
| 5,548,273 | A | 8/1996 | Nicol et al. | 340/439 |
| 5,550,485 | A | 8/1996 | Falk | 324/772 |
| 5,561,380 | A | 10/1996 | Sway-Tin et al. | 324/509 |
| 5,562,501 | A | 10/1996 | Kinoshita et al. | 439/852 |
| 5,563,496 | A | 10/1996 | McClure | 320/128 |
| 5,572,136 | A | 11/1996 | Champlin | 324/426 |
| 5,573,611 | A | 11/1996 | Koch et al. | 152/152.1 |
| 5,574,355 | A | 11/1996 | McShane et al. | 320/161 |
| 5,578,915 | A | 11/1996 | Crouch, Jr. et al. | 324/428 |
| 5,583,416 | A | 12/1996 | Klang | 320/160 |
| 5,585,416 | A | 12/1996 | Audett et al. | 522/35 |
| 5,585,728 | A | 12/1996 | Champlin | 324/427 |
| 5,589,757 | A | 12/1996 | Klang | 320/160 |
| 5,592,093 | A | 1/1997 | Klingbiel | 324/426 |
| 5,592,094 | A | 1/1997 | Ichikawa | 324/427 |
| 5,596,260 | A | 1/1997 | Moravec et al. | 320/135 |
| 5,596,261 | A | 1/1997 | Suyama | 320/152 |
| 5,598,098 | A | 1/1997 | Champlin | 324/430 |
| 5,602,462 | A | 2/1997 | Stich et al. | 323/258 |
| 5,606,242 | A | 2/1997 | Hull et al. | 320/106 |
| 5,614,788 | A | 3/1997 | Mullins et al. | 315/82 |
| 5,621,298 | A | 4/1997 | Harvey | 320/134 |
| 5,631,536 | A | 5/1997 | Tseng | 320/15 |
| 5,631,831 | A | 5/1997 | Bird et al. | 701/34.4 |
| 5,633,985 | A | 5/1997 | Severson et al. | 704/267 |
| 5,637,978 | A | 6/1997 | Kellett et al. | 320/104 |
| 5,642,031 | A | 6/1997 | Brotto | 320/156 |
| 5,644,212 | A | 7/1997 | Takahashi | 320/134 |
| 5,650,937 | A | 7/1997 | Bounaga | 702/65 |
| 5,652,501 | A | 7/1997 | McClure et al. | 340/636.15 |
| 5,653,659 | A | 8/1997 | Kunibe et al. | 477/111 |
| 5,654,623 | A * | 8/1997 | Shiga et al. | 320/106 |
| 5,656,920 | A | 8/1997 | Cherng et al. | 324/431 |
| 5,661,368 | A | 8/1997 | Deol et al. | 315/82 |
| 5,666,040 | A | 9/1997 | Bourbeau | 320/118 |
| 5,675,234 | A | 10/1997 | Greene | 340/636.11 |
| 5,677,077 | A | 10/1997 | Faulk | 429/90 |
| 5,684,678 | A | 11/1997 | Barrett | 363/17 |
| 5,691,621 | A | 11/1997 | Phuoc et al. | 320/134 |
| 5,699,050 | A | 12/1997 | Kanazawa | 340/636.13 |
| 5,701,089 | A | 12/1997 | Perkins | 324/772 |
| 5,705,929 | A | 1/1998 | Caravello et al. | 324/430 |
| 5,707,015 | A | 1/1998 | Guthrie | 241/120 |
| 5,710,503 | A | 1/1998 | Sideris et al. | 320/116 |
| 5,711,648 | A | 1/1998 | Hammerslag | 414/800 |
| 5,712,795 | A | 1/1998 | Layman et al. | 700/297 |
| 5,717,336 | A | 2/1998 | Basell et al. | 324/430 |
| 5,717,937 | A | 2/1998 | Fritz | 713/300 |
| 5,721,688 | A | 2/1998 | Bramwell | 324/426 |
| 5,732,074 | A | 3/1998 | Spaur et al. | 370/313 |
| 5,739,667 | A | 4/1998 | Matsuda et al. | 320/128 |
| 5,744,962 | A | 4/1998 | Alber et al. | 324/426 |
| 5,745,044 | A | 4/1998 | Hyatt, Jr. et al. | 340/5.23 |
| 5,747,189 | A | 5/1998 | Perkins | 429/91 |
| 5,747,909 | A | 5/1998 | Syverson et al. | 310/156.56 |
| 5,747,967 | A | 5/1998 | Muljadi et al. | 320/148 |
| 5,754,417 | A | 5/1998 | Nicollini | 363/60 |
| 5,757,192 | A | 5/1998 | McShane et al. | 324/427 |
| 5,760,587 | A | 6/1998 | Harvey | 324/434 |
| 5,772,468 | A | 6/1998 | Kowalski et al. | 439/506 |
| 5,773,962 | A | 6/1998 | Nor | 20/134 |
| 5,773,978 | A | 6/1998 | Becker | 324/430 |
| 5,778,326 | A | 7/1998 | Moroto et al. | 701/22 |

(56) References Cited

U.S. PATENT DOCUMENTS

| | | | |
|---|---|---|---|
| 5,780,974 A | 7/1998 | Pabla et al. ................... 315/82 |
| 5,780,980 A | 7/1998 | Naito ............................ 318/139 |
| 5,789,899 A | 8/1998 | van Phuoc et al. ........... 320/112 |
| 5,793,359 A | 8/1998 | Ushikubo ...................... 345/169 |
| 5,796,239 A | 8/1998 | van Phuoc et al. ........... 320/107 |
| 5,808,469 A | 9/1998 | Kopera .......................... 324/434 |
| 5,811,979 A | 9/1998 | Rhein ............................ 324/718 |
| 5,818,201 A | 10/1998 | Stockstad et al. ............ 320/119 |
| 5,818,234 A | 10/1998 | McKinnon .................... 324/433 |
| 5,820,407 A | 10/1998 | Morse et al. .................. 439/504 |
| 5,821,756 A | 10/1998 | McShane et al. ............. 324/430 |
| 5,821,757 A | 10/1998 | Alvarez et al. ............... 324/434 |
| 5,825,174 A | 10/1998 | Parker ........................... 324/106 |
| 5,831,435 A * | 11/1998 | Troy .............................. 324/426 |
| 5,832,396 A | 11/1998 | Moroto et al. ................... 701/22 |
| 5,850,113 A | 12/1998 | Weimer et al. ................ 307/125 |
| 5,862,515 A | 1/1999 | Kobayashi et al. ............. 702/63 |
| 5,865,638 A | 2/1999 | Trafton .......................... 439/288 |
| 5,869,951 A | 2/1999 | Takahashi ...................... 320/104 |
| 5,871,858 A | 2/1999 | Thomsen et al. ................. 429/7 |
| 5,872,443 A | 2/1999 | Williamson ................... 320/160 |
| 5,872,453 A | 2/1999 | Shimoyama et al. ......... 324/431 |
| 5,883,306 A | 3/1999 | Hwang ........................ 73/146.8 |
| 5,884,202 A | 3/1999 | Arjomand .................... 701/31.4 |
| 5,895,440 A | 4/1999 | Proctor et al. ................... 702/63 |
| 5,903,154 A | 5/1999 | Zhang et al. .................. 324/437 |
| 5,903,716 A | 5/1999 | Kimber et al. ................ 395/114 |
| 5,912,534 A | 6/1999 | Benedict ......................... 315/82 |
| 5,914,605 A | 6/1999 | Bertness ........................ 324/430 |
| 5,916,287 A | 6/1999 | Arjomand et al. ........... 701/33.2 |
| 5,927,938 A | 7/1999 | Hammerslag .................. 414/809 |
| 5,929,609 A | 7/1999 | Joy et al. ......................... 322/25 |
| 5,935,180 A | 8/1999 | Fieramosca et al. ......... 701/29.6 |
| 5,939,855 A | 8/1999 | Proctor et al. ................. 320/104 |
| 5,939,861 A | 8/1999 | Joko et al. .................... 320/122 |
| 5,945,829 A | 8/1999 | Bertness ........................ 324/430 |
| 5,946,605 A | 8/1999 | Takahisa et al. ............... 455/68 |
| 5,950,144 A | 9/1999 | Hall et al. ..................... 702/108 |
| 5,951,229 A | 9/1999 | Hammerslag .................. 414/398 |
| 5,953,322 A * | 9/1999 | Kimball ......................... 370/328 |
| 5,955,951 A | 9/1999 | Wischerop et al. ........ 340/572.8 |
| 5,961,561 A | 10/1999 | Wakefield, II ................... 701/29 |
| 5,961,604 A | 10/1999 | Anderson et al. ............. 709/229 |
| 5,963,012 A | 10/1999 | Garcia et al. .................. 320/106 |
| 5,969,625 A | 10/1999 | Russo ...................... 340/636.19 |
| 5,973,598 A | 10/1999 | Beigel ........................ 340/572.1 |
| 5,978,805 A | 11/1999 | Carson ............................ 707/10 |
| 5,982,138 A | 11/1999 | Krieger ......................... 320/105 |
| 5,990,664 A | 11/1999 | Rahman ........................ 320/136 |
| 6,002,238 A | 12/1999 | Champlin ..................... 320/134 |
| 6,005,489 A | 12/1999 | Siegle et al. .............. 340/825.69 |
| 6,005,759 A | 12/1999 | Hart et al. ........................ 361/66 |
| 6,008,652 A | 12/1999 | Theofanopoulos et al. ... 324/434 |
| 6,009,369 A | 12/1999 | Boisvert et al. ................. 701/99 |
| 6,016,047 A | 1/2000 | Notten et al. .................. 320/137 |
| 6,031,354 A | 2/2000 | Wiley et al. ................... 320/116 |
| 6,031,368 A | 2/2000 | Klippel et al. ................. 324/133 |
| 6,037,745 A | 3/2000 | Koike et al. ................... 320/104 |
| 6,037,749 A | 3/2000 | Parsonage ..................... 320/132 |
| 6,037,751 A | 3/2000 | Klang ............................ 320/160 |
| 6,037,777 A | 3/2000 | Champlin ...................... 324/430 |
| 6,037,778 A | 3/2000 | Makhija ......................... 324/433 |
| 6,046,514 A | 4/2000 | Rouillard et al. ............... 307/77 |
| 6,051,976 A * | 4/2000 | Bertness ........................ 324/426 |
| 6,055,468 A | 4/2000 | Kaman et al. ................... 701/29 |
| 6,061,638 A * | 5/2000 | Joyce .............................. 702/63 |
| 6,064,372 A | 5/2000 | Kahkoska ..................... 345/173 |
| 6,072,299 A | 6/2000 | Kurle et al. ................... 320/112 |
| 6,072,300 A | 6/2000 | Tsuji .............................. 320/116 |
| 6,075,339 A | 6/2000 | Reipur et al. .................. 320/110 |
| 6,081,098 A | 6/2000 | Bertness et al. ............... 320/134 |
| 6,081,109 A | 6/2000 | Seymour et al. .............. 324/127 |
| 6,087,815 A | 7/2000 | Pfeifer et al. .................. 323/282 |
| 6,091,238 A | 7/2000 | McDermott ............... 324/207.2 |
| 6,091,245 A | 7/2000 | Bertness ........................ 324/426 |
| 6,094,033 A | 7/2000 | Ding et al. .................... 320/132 |
| 6,097,193 A | 8/2000 | Bramwell ...................... 324/429 |
| 6,100,670 A | 8/2000 | Levesque ...................... 320/150 |
| 6,100,815 A | 8/2000 | Pailthorp .................. 324/754.07 |
| 6,104,167 A | 8/2000 | Bertness et al. ............... 320/132 |
| 6,113,262 A | 9/2000 | Purola et al. .................... 374/45 |
| 6,114,834 A | 9/2000 | Parise ............................ 320/109 |
| 6,121,880 A | 9/2000 | Scott et al. ................. 340/572.5 |
| 6,136,914 A | 10/2000 | Hergenrother et al. ....... 524/495 |
| 6,137,269 A | 10/2000 | Champlin ...................... 320/150 |
| 6,140,797 A | 10/2000 | Dunn ............................. 320/105 |
| 6,141,608 A | 10/2000 | Rother .......................... 701/29.6 |
| 6,144,185 A | 11/2000 | Dougherty et al. ........... 320/132 |
| 6,147,598 A | 11/2000 | Murphy et al. ........... 340/426.19 |
| 6,150,793 A | 11/2000 | Lesesky et al. ............... 320/104 |
| 6,158,000 A | 12/2000 | Collins ............................. 713/1 |
| 6,161,640 A | 12/2000 | Yamaguchi .................. 180/65.8 |
| 6,163,156 A | 12/2000 | Bertness ........................ 324/426 |
| 6,164,063 A | 12/2000 | Mendler .......................... 60/274 |
| 6,167,349 A | 12/2000 | Alvarez ........................... 702/63 |
| 6,172,483 B1 | 1/2001 | Champlin ...................... 320/134 |
| 6,172,505 B1 | 1/2001 | Bertness ........................ 324/430 |
| 6,177,737 B1 | 1/2001 | Palfey et al. ..................... 307/64 |
| 6,181,545 B1 | 1/2001 | Amatucci et al. ............. 361/502 |
| 6,184,656 B1 | 2/2001 | Karunasiri et al. ........... 320/119 |
| 6,191,557 B1 | 2/2001 | Gray et al. .................... 320/132 |
| 6,202,739 B1 | 3/2001 | Pal et al. .................... 165/104.33 |
| 6,211,651 B1 | 4/2001 | Nemoto ......................... 320/133 |
| 6,215,275 B1 | 4/2001 | Bean ............................. 320/106 |
| 6,218,805 B1 | 4/2001 | Melcher ........................ 320/105 |
| 6,218,936 B1 | 4/2001 | Imao ............................. 340/447 |
| 6,222,342 B1 | 4/2001 | Eggert et al. .................. 320/105 |
| 6,222,369 B1 | 4/2001 | Champlin ...................... 324/430 |
| D442,503 S | 5/2001 | Lundbeck et al. .............. D10/77 |
| 6,225,808 B1 | 5/2001 | Varghese et al. .............. 324/426 |
| 6,225,898 B1 | 5/2001 | Kamiya et al. ................ 340/505 |
| 6,236,186 B1 | 5/2001 | Helton et al. .................. 320/106 |
| 6,236,332 B1 | 5/2001 | Conkright et al. .............. 340/3.1 |
| 6,236,949 B1 | 5/2001 | Hart ................................ 702/64 |
| 6,238,253 B1 | 5/2001 | Qualls ........................... 439/759 |
| 6,242,887 B1 | 6/2001 | Burke ............................ 320/104 |
| 6,249,124 B1 | 6/2001 | Bertness ........................ 324/426 |
| 6,250,973 B1 | 6/2001 | Lowery et al. ................ 439/763 |
| 6,254,438 B1 | 7/2001 | Gaunt ............................ 439/755 |
| 6,259,170 B1 | 7/2001 | Limoge et al. ............... 307/10.8 |
| 6,259,254 B1 | 7/2001 | Klang ............................ 324/427 |
| 6,262,563 B1 | 7/2001 | Champlin ...................... 320/134 |
| 6,262,692 B1 | 7/2001 | Babb ............................. 343/895 |
| 6,263,268 B1 | 7/2001 | Nathanson ....................... 701/29 |
| 6,263,322 B1 | 7/2001 | Kirkevold et al. ............ 705/400 |
| 6,271,643 B1 | 8/2001 | Becker et al. ................. 320/112 |
| 6,271,748 B1 | 8/2001 | Derbyshire et al. ........... 340/442 |
| 6,272,387 B1 | 8/2001 | Yoon ............................... 700/83 |
| 6,275,008 B1 | 8/2001 | Arai et al. ..................... 320/132 |
| 6,285,191 B1 | 9/2001 | Gollomp et al. .............. 324/427 |
| 6,294,896 B1 | 9/2001 | Champlin ...................... 320/134 |
| 6,294,897 B1 | 9/2001 | Champlin ...................... 320/153 |
| 6,304,087 B1 | 10/2001 | Bertness ........................ 324/426 |
| 6,307,349 B1 | 10/2001 | Koenck et al. ................ 320/112 |
| 6,310,481 B2 | 10/2001 | Bertness ........................ 324/430 |
| 6,313,607 B1 | 11/2001 | Champlin ...................... 320/132 |
| 6,313,608 B1 | 11/2001 | Varghese et al. .............. 320/132 |
| 6,316,914 B1 | 11/2001 | Bertness ........................ 320/134 |
| 6,320,351 B1 | 11/2001 | Ng et al. ........................ 320/104 |
| 6,323,650 B1 | 11/2001 | Bertness et al. ............... 324/426 |
| 6,324,042 B1 | 11/2001 | Andrews ...................... 361/93.2 |
| 6,329,793 B1 | 12/2001 | Bertness et al. ............... 320/132 |
| 6,331,762 B1 | 12/2001 | Bertness ........................ 320/134 |
| 6,332,113 B1 | 12/2001 | Bertness ........................ 702/63 |
| 6,346,795 B2 | 2/2002 | Haraguchi et al. ............ 320/136 |
| 6,347,958 B1 | 2/2002 | Tsai ............................... 439/488 |
| 6,351,102 B1 | 2/2002 | Troy .............................. 320/139 |
| 6,356,042 B1 | 3/2002 | Kahlon et al. ................. 318/138 |
| 6,356,083 B1 | 3/2002 | Ying .............................. 324/426 |
| 6,359,441 B1 | 3/2002 | Bertness ........................ 324/426 |
| 6,359,442 B1 | 3/2002 | Henningson et al. ......... 324/426 |
| 6,363,303 B1 | 3/2002 | Bertness .......................... 701/29 |
| RE37,677 E | 4/2002 | Irie ................................. 315/83 |
| 6,377,031 B1 | 4/2002 | Karuppana et al. ........... 323/220 |

(56) References Cited

U.S. PATENT DOCUMENTS

| | | | |
|---|---|---|---|
| 6,384,608 B1 | 5/2002 | Namaky | 324/430 |
| 6,388,448 B1 | 5/2002 | Cervas | 324/426 |
| 6,389,337 B1 | 5/2002 | Kolls | 701/31.6 |
| 6,392,414 B2 | 5/2002 | Bertness | 324/429 |
| 6,396,278 B1 | 5/2002 | Makhija | 324/402 |
| 6,407,554 B1 | 6/2002 | Godau et al. | 324/503 |
| 6,411,098 B1 | 6/2002 | Laletin | 324/436 |
| 6,417,669 B1 | 7/2002 | Champlin | 324/426 |
| 6,420,852 B1 | 7/2002 | Sato | 320/134 |
| 6,424,157 B1 | 7/2002 | Gollomp et al. | 324/430 |
| 6,424,158 B2 | 7/2002 | Klang | 324/433 |
| 6,437,957 B1 | 8/2002 | Karuppana et al. | 361/78 |
| 6,441,585 B1 | 8/2002 | Bertness | 320/132 |
| 6,445,158 B1 | 9/2002 | Bertness et al. | 320/104 |
| 6,448,778 B1 | 9/2002 | Rankin | 324/503 |
| 6,449,726 B1 | 9/2002 | Smith | 713/340 |
| 6,456,036 B1 | 9/2002 | Thandiwe | 320/106 |
| 6,456,045 B1 | 9/2002 | Troy et al. | 320/139 |
| 6,465,908 B1 | 10/2002 | Karuppana et al. | 307/31 |
| 6,466,025 B1 | 10/2002 | Klang | 324/429 |
| 6,466,026 B1 | 10/2002 | Champlin | 324/430 |
| 6,469,511 B1 | 10/2002 | Vonderhaar et al. | 324/425 |
| 6,473,659 B1 | 10/2002 | Shah et al. | 700/79 |
| 6,477,478 B1 | 11/2002 | Jones et al. | 702/102 |
| 6,495,990 B2 | 12/2002 | Champlin | 320/132 |
| 6,497,209 B1 | 12/2002 | Karuppana et al. | 123/179.3 |
| 6,500,025 B1 | 12/2002 | Moenkhaus et al. | 439/502 |
| 6,505,507 B1 | 1/2003 | Imao | 73/146.5 |
| 6,507,196 B2 | 1/2003 | Thomsen et al. | 324/436 |
| 6,526,361 B1 | 2/2003 | Jones et al. | 702/63 |
| 6,529,723 B1 | 3/2003 | Bentley | 455/405 |
| 6,531,848 B1 | 3/2003 | Chitsazan et al. | 320/153 |
| 6,532,425 B1 | 3/2003 | Boost et al. | 702/63 |
| 6,533,316 B2 | 3/2003 | Breed et al. | 280/735 |
| 6,534,992 B2 | 3/2003 | Meissner et al. | 324/426 |
| 6,534,993 B2 | 3/2003 | Bertness | 324/433 |
| 6,536,536 B1 | 3/2003 | Gass et al. | 173/2 |
| 6,544,078 B2 | 4/2003 | Palmisano et al. | 439/762 |
| 6,545,599 B2 | 4/2003 | Derbyshire et al. | 340/442 |
| 6,556,019 B2 | 4/2003 | Bertness | 324/426 |
| 6,566,883 B1 | 5/2003 | Vonderhaar et al. | 324/426 |
| 6,570,385 B1 | 5/2003 | Roberts et al. | 324/378 |
| 6,577,107 B2 | 6/2003 | Kechmire | 320/139 |
| 6,586,941 B2 | 7/2003 | Bertness et al. | 324/426 |
| 6,597,150 B1 | 7/2003 | Bertness et al. | 320/104 |
| 6,599,243 B2 | 7/2003 | Woltermann et al. | 600/300 |
| 6,600,815 B1 | 7/2003 | Walding | 379/93.07 |
| 6,611,740 B2 | 8/2003 | Lowrey et al. | 701/29 |
| 6,614,349 B1 | 9/2003 | Proctor et al. | 340/572.1 |
| 6,618,644 B2 | 9/2003 | Bean | 700/231 |
| 6,621,272 B2 | 9/2003 | Champlin | 324/426 |
| 6,623,314 B1 | 9/2003 | Cox et al. | 439/759 |
| 6,624,635 B1 * | 9/2003 | Lui | 324/426 |
| 6,628,011 B2 | 9/2003 | Droppo et al. | 307/11 |
| 6,629,054 B2 | 9/2003 | Makhija et al. | 702/113 |
| 6,633,165 B2 | 10/2003 | Bertness | 324/426 |
| 6,635,974 B1 | 10/2003 | Karuppana et al. | 307/140 |
| 6,636,790 B1 | 10/2003 | Lightner et al. | 701/31.5 |
| 6,667,624 B1 | 12/2003 | Raichle et al. | 324/522 |
| 6,679,212 B2 | 1/2004 | Kelling | 123/179.28 |
| 6,686,542 B2 | 2/2004 | Zhang | 174/74 |
| 6,696,819 B2 | 2/2004 | Bertness | 320/134 |
| 6,707,303 B2 | 3/2004 | Bertness et al. | 324/426 |
| 6,732,031 B1 | 5/2004 | Lightner et al. | 701/31.4 |
| 6,736,941 B2 | 5/2004 | Oku et al. | 203/68 |
| 6,737,831 B2 | 5/2004 | Champlin | 320/132 |
| 6,738,697 B2 | 5/2004 | Breed | 701/29 |
| 6,740,990 B2 | 5/2004 | Tozuka et al. | 307/9.1 |
| 6,744,149 B1 | 6/2004 | Karuppana et al. | 307/31 |
| 6,745,153 B2 | 6/2004 | White et al. | 702/184 |
| 6,759,849 B2 | 7/2004 | Bertness | 324/426 |
| 6,771,073 B2 | 8/2004 | Henningson et al. | 324/426 |
| 6,777,945 B2 | 8/2004 | Roberts et al. | 324/426 |
| 6,781,344 B1 | 8/2004 | Hedegor et al. | 320/106 |
| 6,781,382 B2 | 8/2004 | Johnson | 324/426 |
| 6,784,635 B2 | 8/2004 | Larson | 320/104 |
| 6,784,637 B2 | 8/2004 | Raichle et al. | 320/107 |
| 6,788,025 B2 | 9/2004 | Bertness et al. | 320/104 |
| 6,795,782 B2 | 9/2004 | Bertness et al. | 702/63 |
| 6,796,841 B1 | 9/2004 | Cheng et al. | 439/620.3 |
| 6,805,090 B2 | 10/2004 | Bertness et al. | 123/198 |
| 6,806,716 B2 | 10/2004 | Bertness et al. | 324/426 |
| 6,825,669 B2 | 11/2004 | Raichle et al. | 324/426 |
| 6,832,141 B2 | 12/2004 | Skeen et al. | 701/31.4 |
| 6,842,707 B2 | 1/2005 | Raichle et al. | 702/62 |
| 6,845,279 B1 | 1/2005 | Gilmore et al. | 700/115 |
| 6,850,037 B2 | 2/2005 | Bertness | 320/132 |
| 6,856,162 B1 | 2/2005 | Greatorex et al. | 324/764.01 |
| 6,856,972 B1 | 2/2005 | Yun et al. | 705/36 R |
| 6,871,151 B2 | 3/2005 | Bertness | 702/63 |
| 6,885,195 B2 | 4/2005 | Bertness | 324/426 |
| 6,888,468 B2 | 5/2005 | Bertness | 340/636.15 |
| 6,891,378 B2 | 5/2005 | Bertness et al. | 324/426 |
| 6,904,796 B2 | 6/2005 | Pacsai et al. | 73/146.8 |
| 6,906,522 B2 | 6/2005 | Bertness et al. | 324/426 |
| 6,906,523 B2 | 6/2005 | Bertness et al. | 324/426 |
| 6,906,624 B2 | 6/2005 | McClelland et al. | 340/442 |
| 6,909,287 B2 | 6/2005 | Bertness | 324/427 |
| 6,909,356 B2 | 6/2005 | Brown et al. | 340/3.2 |
| 6,913,483 B2 | 7/2005 | Restaino et al. | 439/504 |
| 6,914,413 B2 | 7/2005 | Bertness et al. | 320/104 |
| 6,919,725 B2 | 7/2005 | Bertness et al. | 324/433 |
| 6,930,485 B2 | 8/2005 | Bertness et al. | 324/426 |
| 6,933,727 B2 | 8/2005 | Bertness et al. | 324/426 |
| 6,941,234 B2 | 9/2005 | Bertness et al. | 702/63 |
| 6,957,133 B1 | 10/2005 | Hunt et al. | 701/32.4 |
| 6,967,484 B2 | 11/2005 | Bertness | 324/426 |
| 6,972,662 B1 | 12/2005 | Ohkawa et al. | 340/10.1 |
| 6,983,212 B2 | 1/2006 | Burns | 702/63 |
| 6,993,421 B2 | 1/2006 | Pillar et al. | 701/29.4 |
| 6,998,847 B2 | 2/2006 | Bertness et al. | 324/426 |
| 7,003,410 B2 | 2/2006 | Bertness et al. | 702/63 |
| 7,003,411 B2 | 2/2006 | Bertness | 702/63 |
| 7,012,433 B2 | 3/2006 | Smith et al. | 324/426 |
| 7,015,674 B2 | 3/2006 | VonderHaar | 320/103 |
| 7,029,338 B1 | 4/2006 | Orange et al. | 439/755 |
| 7,034,541 B2 | 4/2006 | Bertness et al. | 324/426 |
| 7,039,533 B2 | 5/2006 | Bertness et al. | 702/63 |
| 7,042,346 B2 | 5/2006 | Paulsen | 340/438 |
| 7,058,525 B2 | 6/2006 | Bertness et al. | 702/63 |
| 7,081,755 B2 | 7/2006 | Klang et al. | 324/426 |
| 7,089,127 B2 | 8/2006 | Thibedeau et al. | 702/63 |
| 7,098,666 B2 | 8/2006 | Patino | 324/433 |
| 7,102,556 B2 | 9/2006 | White | 341/141 |
| 7,106,070 B2 | 9/2006 | Bertness et al. | 324/538 |
| 7,116,109 B2 | 10/2006 | Klang | 324/426 |
| 7,119,686 B2 | 10/2006 | Bertness et al. | 340/572.1 |
| 7,120,488 B2 | 10/2006 | Nova et al. | 600/2 |
| 7,126,341 B2 | 10/2006 | Bertness et al. | 324/426 |
| 7,129,706 B2 | 10/2006 | Kalley | 324/426 |
| 7,154,276 B2 | 12/2006 | Bertness | 324/503 |
| 7,170,393 B2 | 1/2007 | Martin | 340/10.1 |
| 7,177,925 B2 | 2/2007 | Carcido et al. | 709/223 |
| 7,182,147 B2 | 2/2007 | Cutler et al. | 173/1 |
| 7,184,905 B2 | 2/2007 | Stefan | 702/63 |
| 7,198,510 B2 | 4/2007 | Bertness | 439/500 |
| 7,200,424 B2 | 4/2007 | Tischer et al. | 455/567 |
| 7,202,636 B2 | 4/2007 | Reynolds et al. | 320/166 |
| 7,208,914 B2 | 4/2007 | Klang | 320/132 |
| 7,209,850 B2 | 4/2007 | Brott et al. | 324/426 |
| 7,209,860 B2 | 4/2007 | Trsar et al. | 702/183 |
| 7,212,887 B2 | 5/2007 | Shah et al | 700/276 |
| 7,219,023 B2 | 5/2007 | Banke et al. | 702/58 |
| 7,233,128 B2 | 6/2007 | Brost et al. | 320/132 |
| 7,235,977 B2 | 6/2007 | Koran et al. | 324/426 |
| 7,246,015 B2 | 7/2007 | Bertness et al. | 702/63 |
| 7,272,519 B2 | 9/2007 | Lesesky et al. | 702/63 |
| 7,287,001 B1 | 10/2007 | Falls et al. | 705/22 |
| 7,295,936 B2 | 11/2007 | Bertness et al. | 702/63 |
| 7,319,304 B2 | 1/2008 | Veloo et al. | 320/134 |
| 7,339,477 B2 | 3/2008 | Puzio et al. | 340/572.1 |
| 7,363,175 B2 | 4/2008 | Bertness et al. | 702/63 |
| 7,398,176 B2 | 7/2008 | Bertness | 702/140 |
| 7,408,358 B2 | 8/2008 | Knopf | 324/426 |

(56) References Cited

U.S. PATENT DOCUMENTS

| | | | |
|---|---|---|---|
| 7,425,833 B2 | 9/2008 | Bertness et al. | 324/426 |
| 7,446,536 B2 | 11/2008 | Bertness | 324/426 |
| 7,453,238 B2 | 11/2008 | Melichar | 320/132 |
| 7,479,763 B2 | 1/2009 | Bertness | 320/134 |
| 7,498,767 B2 | 3/2009 | Brown et al. | 320/107 |
| 7,501,795 B2 | 3/2009 | Bertness et al. | 320/134 |
| 7,505,856 B2 | 3/2009 | Restaino et al. | 702/63 |
| 7,545,146 B2 | 6/2009 | Klang et al. | 324/426 |
| 7,557,586 B1 | 7/2009 | Vonderhaar et al. | 324/437 |
| 7,590,476 B2 | 9/2009 | Shumate | 701/31.6 |
| 7,592,776 B2 | 9/2009 | Tsukamoto et al. | 320/136 |
| 7,595,643 B2 | 9/2009 | Klang | 324/426 |
| 7,598,699 B2 | 10/2009 | Restaino et al. | 320/105 |
| 7,598,743 B2 | 10/2009 | Bertness | 324/426 |
| 7,598,744 B2 | 10/2009 | Bertness et al. | 324/426 |
| 7,619,417 B2 | 11/2009 | Klang | 324/427 |
| 7,642,786 B2 | 1/2010 | Philbrook | 324/426 |
| 7,642,787 B2 | 1/2010 | Bertness et al. | 324/426 |
| 7,656,162 B2 | 2/2010 | Vonderhaar et al. | 324/426 |
| 7,657,386 B2 | 2/2010 | Thibedeau et al. | 702/63 |
| 7,667,437 B2 | 2/2010 | Johnson et al. | 320/150 |
| 7,679,325 B2 | 3/2010 | Seo | 20/116 |
| 7,684,908 B1 | 3/2010 | Ogilvie et al. | 701/29.6 |
| 7,688,074 B2 | 3/2010 | Cox et al. | 324/426 |
| 7,698,179 B2 | 4/2010 | Leung et al. | 705/28 |
| 7,705,602 B2 | 4/2010 | Bertness | 324/426 |
| 7,706,991 B2 | 4/2010 | Bertness et al. | 702/63 |
| 7,710,119 B2 | 5/2010 | Bertness | 324/426 |
| 7,723,993 B2 | 5/2010 | Klang | 324/431 |
| 7,728,556 B2 | 6/2010 | Yano et al. | 320/134 |
| 7,728,597 B2 | 6/2010 | Bertness | 324/426 |
| 7,751,953 B2* | 7/2010 | Namaky | 701/33.2 |
| 7,772,850 B2 | 8/2010 | Bertness | 324/426 |
| 7,774,151 B2 | 8/2010 | Bertness | 702/63 |
| 7,777,612 B2 | 8/2010 | Sampson et al. | 340/426.1 |
| 7,791,348 B2 | 9/2010 | Brown et al. | 324/426 |
| 7,808,375 B2 | 10/2010 | Bertness et al. | 340/455 |
| 7,848,857 B2 | 12/2010 | Nasr et al. | 701/22 |
| 7,883,002 B2 | 2/2011 | Jin et al. | 235/376 |
| 7,902,990 B2 | 3/2011 | Delmonico et al. | 340/636.1 |
| 7,924,015 B2 | 4/2011 | Bertness | 324/427 |
| 7,940,053 B2 | 5/2011 | Brown et al. | 324/426 |
| 7,999,505 B2 | 8/2011 | Bertness | 320/104 |
| 8,164,343 B2 | 4/2012 | Bertness | 324/503 |
| 8,306,690 B2 | 11/2012 | Bertness | 701/34.4 |
| 2001/0035737 A1 | 11/2001 | Nakanishi et al. | 320/122 |
| 2001/0048215 A1 | 12/2001 | Breed et al. | 280/728.1 |
| 2002/0004694 A1 | 1/2002 | McLeod | 701/29 |
| 2002/0007237 A1 | 1/2002 | Phung et al. | 701/33 |
| 2002/0010558 A1 | 1/2002 | Bertness et al. | 702/63 |
| 2002/0021135 A1 | 2/2002 | Li et al. | 324/677 |
| 2002/0027346 A1 | 3/2002 | Breed et al. | 280/735 |
| 2002/0030495 A1 | 3/2002 | Kechmire | 324/427 |
| 2002/0041175 A1 | 4/2002 | Lauper et al. | 320/106 |
| 2002/0044050 A1 | 4/2002 | Derbyshire et al. | 340/442 |
| 2002/0050163 A1 | 5/2002 | Makhija et al. | 73/116 |
| 2002/0074398 A1 | 6/2002 | Lancos et al. | 235/382 |
| 2002/0118111 A1 | 8/2002 | Brown et al. | 340/573.1 |
| 2002/0121901 A1 | 9/2002 | Hoffman | 324/426 |
| 2002/0128985 A1 | 9/2002 | Greenwald | 705/400 |
| 2002/0171428 A1 | 11/2002 | Bertness | 702/63 |
| 2002/0176010 A1 | 11/2002 | Wallach et al. | 348/362 |
| 2003/0006779 A1 | 1/2003 | Youval | 324/503 |
| 2003/0009270 A1 | 1/2003 | Breed | 701/29 |
| 2003/0025481 A1 | 2/2003 | Bertness | 324/427 |
| 2003/0036909 A1 | 2/2003 | Kato | 704/275 |
| 2003/0040873 A1 | 2/2003 | Lesesky et al. | 702/57 |
| 2003/0060953 A1 | 3/2003 | Chen | 701/33 |
| 2003/0078743 A1 | 4/2003 | Bertness et al. | 702/63 |
| 2003/0088375 A1 | 5/2003 | Bertness et al. | 702/63 |
| 2003/0124417 A1 | 7/2003 | Bertness et al. | 429/90 |
| 2003/0128036 A1 | 7/2003 | Henningson et al. | 324/426 |
| 2003/0137277 A1 | 7/2003 | Mori et al. | 320/132 |
| 2003/0169018 A1 | 9/2003 | Berels et al. | 320/132 |
| 2003/0169019 A1 | 9/2003 | Oosaki | 320/132 |
| 2003/0171111 A1 | 9/2003 | Clark | 455/414.1 |
| 2003/0177417 A1 | 9/2003 | Malhotra et al. | 714/42 |
| 2003/0184262 A1 | 10/2003 | Makhija | 320/156 |
| 2003/0184306 A1 | 10/2003 | Bertness et al. | 324/426 |
| 2003/0187556 A1 | 10/2003 | Suzuki | 701/29 |
| 2003/0194672 A1 | 10/2003 | Roberts et al. | 431/196 |
| 2003/0197512 A1 | 10/2003 | Miller et al. | 324/426 |
| 2003/0212311 A1 | 11/2003 | Nova et al. | 600/300 |
| 2003/0214395 A1 | 11/2003 | Flowerday et al. | 340/445 |
| 2004/0000590 A1 | 1/2004 | Raichle et al. | 235/462.01 |
| 2004/0000891 A1 | 1/2004 | Raichle et al. | 320/107 |
| 2004/0000893 A1 | 1/2004 | Raichle et al. | 320/135 |
| 2004/0000913 A1 | 1/2004 | Raichle et al. | 324/426 |
| 2004/0000915 A1 | 1/2004 | Raichle et al. | 324/522 |
| 2004/0002824 A1 | 1/2004 | Raichle et al. | 702/63 |
| 2004/0002825 A1 | 1/2004 | Raichle et al. | 702/63 |
| 2004/0002836 A1 | 1/2004 | Raichle et al. | 702/188 |
| 2004/0032264 A1 | 2/2004 | Schoch | 324/426 |
| 2004/0036443 A1 | 2/2004 | Bertness | 320/109 |
| 2004/0044452 A1 | 3/2004 | Bauer et al. | 703/33 |
| 2004/0044454 A1 | 3/2004 | Ross et al. | 701/33 |
| 2004/0049361 A1 | 3/2004 | Hamdan et al. | 702/115 |
| 2004/0051533 A1 | 3/2004 | Namaky | 324/426 |
| 2004/0051534 A1 | 3/2004 | Kobayashi et al. | 324/429 |
| 2004/0054503 A1 | 3/2004 | Namaky | 702/182 |
| 2004/0064225 A1 | 4/2004 | Jammu et al. | 701/29 |
| 2004/0088087 A1 | 5/2004 | Fukushima et al. | 701/32 |
| 2004/0113588 A1 | 6/2004 | Mikuriya et al. | 320/128 |
| 2004/0145342 A1 | 7/2004 | Lyon | 320/108 |
| 2004/0164706 A1 | 8/2004 | Osborne | 320/116 |
| 2004/0172177 A1 | 9/2004 | Nagai et al. | 701/29 |
| 2004/0178185 A1 | 9/2004 | Yoshikawa et al. | 219/270 |
| 2004/0199343 A1 | 10/2004 | Cardinal et al. | 702/63 |
| 2004/0207367 A1 | 10/2004 | Taniguchi et al. | 320/149 |
| 2004/0227523 A1 | 11/2004 | Namaky | 324/537 |
| 2004/0239332 A1 | 12/2004 | Mackel et al. | 324/426 |
| 2004/0251876 A1 | 12/2004 | Bertness et al. | 320/136 |
| 2005/0007068 A1 | 1/2005 | Johnson et al. | 320/110 |
| 2005/0017726 A1 | 1/2005 | Koran et al. | 324/433 |
| 2005/0021294 A1 | 1/2005 | Trsar et al. | 702/183 |
| 2005/0025299 A1 | 2/2005 | Tischer et al. | 379/199 |
| 2005/0043868 A1 | 2/2005 | Mitcham | 701/29 |
| 2005/0057256 A1 | 3/2005 | Bertness | 324/426 |
| 2005/0060070 A1 | 3/2005 | Kapolka et al. | 701/29 |
| 2005/0073314 A1 | 4/2005 | Bertness et al. | 324/433 |
| 2005/0076381 A1 | 4/2005 | Gross | 725/107 |
| 2005/0096809 A1 | 5/2005 | Skeen et al. | 701/29 |
| 2005/0102073 A1 | 5/2005 | Ingram | 701/29 |
| 2005/0128083 A1 | 6/2005 | Puzio et al. | 340/572.1 |
| 2005/0128902 A1 | 6/2005 | Tsai | 369/44.32 |
| 2005/0143882 A1 | 6/2005 | Umezawa | 701/29 |
| 2005/0159847 A1 | 7/2005 | Shah et al. | 700/276 |
| 2005/0162172 A1 | 7/2005 | Bertness | 324/426 |
| 2005/0168226 A1 | 8/2005 | Quint et al. | 324/426 |
| 2005/0173142 A1 | 8/2005 | Cutler et al. | 173/181 |
| 2005/0182536 A1 | 8/2005 | Doyle et al. | 701/29 |
| 2005/0212521 A1 | 9/2005 | Bertness et al. | 324/426 |
| 2005/0218902 A1 | 10/2005 | Restaino et al. | 324/433 |
| 2005/0231205 A1 | 10/2005 | Bertness et al. | 324/426 |
| 2005/0254106 A9 | 11/2005 | Silverbrook et al. | 358/539 |
| 2005/0256617 A1 | 11/2005 | Cawthorne et al. | 701/22 |
| 2005/0258241 A1 | 11/2005 | McNutt et al. | 235/385 |
| 2006/0012330 A1 | 1/2006 | Okumura et al. | 320/103 |
| 2006/0030980 A1 | 2/2006 | St. Denis | 701/29 |
| 2006/0089767 A1 | 4/2006 | Sowa | 701/29 |
| 2006/0095230 A1 | 5/2006 | Grier et al. | 702/183 |
| 2006/0161313 A1 | 7/2006 | Rogers et al. | 701/1 |
| 2006/0161390 A1 | 7/2006 | Namaky et al. | 702/183 |
| 2006/0217914 A1 | 9/2006 | Bertness | 702/113 |
| 2006/0282323 A1 | 12/2006 | Walker et al. | 705/14 |
| 2007/0024460 A1 | 2/2007 | Clark | 340/663 |
| 2007/0026916 A1 | 2/2007 | Juds et al. | 463/1 |
| 2007/0046261 A1 | 3/2007 | Porebski | 320/132 |
| 2007/0088472 A1 | 4/2007 | Ganzhorn et al. | 701/33 |
| 2007/0159177 A1 | 7/2007 | Bertness et al. | 324/426 |
| 2007/0194791 A1 | 8/2007 | Huang | 324/430 |
| 2007/0194793 A1 | 8/2007 | Bertness | 324/503 |
| 2007/0259256 A1 | 11/2007 | Le Canut et al. | 429/90 |
| 2008/0036421 A1 | 2/2008 | Seo et al. | 320/132 |

(56) References Cited

U.S. PATENT DOCUMENTS

| | | | |
|---|---|---|---|
| 2008/0059014 A1 | 3/2008 | Nasr et al. | 701/22 |
| 2008/0086246 A1 | 4/2008 | Bolt et al. | 701/29 |
| 2008/0094068 A1 | 4/2008 | Scott | 324/426 |
| 2008/0169818 A1 | 7/2008 | Lesesky et al. | 324/426 |
| 2008/0303528 A1 | 12/2008 | Kim | 324/430 |
| 2008/0303529 A1 | 12/2008 | Nakamura et al. | 324/433 |
| 2008/0315830 A1 | 12/2008 | Bertness | 320/104 |
| 2009/0006476 A1 | 1/2009 | Andreasen et al. | 707/104.1 |
| 2009/0024266 A1 | 1/2009 | Bertness | 701/22 |
| 2009/0085571 A1 | 4/2009 | Bertness | 324/426 |
| 2009/0146800 A1 | 6/2009 | Grimlund et al. | 340/505 |
| 2009/0198372 A1 | 8/2009 | Hammerslag | 700/226 |
| 2009/0247020 A1 | 10/2009 | Gathman et al. | 439/759 |
| 2009/0276115 A1 | 11/2009 | Chen | 701/32 |
| 2010/0023198 A1 | 1/2010 | Hamilton | 701/29 |
| 2010/0145780 A1 | 6/2010 | Nishikawa et al. | 705/14.11 |
| 2010/0314950 A1 | 12/2010 | Rutkowski et al. | 307/125 |
| 2011/0004427 A1 | 1/2011 | Gorbold et al. | 702/63 |
| 2011/0273181 A1 | 11/2011 | Park et al. | 324/429 |
| 2012/0046824 A1 | 2/2012 | Ruther et al. | 701/31.5 |
| 2013/0158782 A1 | 6/2013 | Bertness et al. | 701/34.4 |

FOREIGN PATENT DOCUMENTS

| | | |
|---|---|---|
| DE | 10 2008 036 595 A1 | 2/2010 |
| EP | 0 022 450 A1 | 1/1981 |
| EP | 0 476 405 A1 | 9/1991 |
| EP | 0 637 754 A1 | 2/1995 |
| EP | 0 772 056 A1 | 5/1997 |
| EP | 0 982 159 A2 | 3/2000 |
| EP | 1 810 869 A1 | 11/2004 |
| EP | 1 807 710 B1 | 7/2007 |
| EP | 1 807 710 | 1/2010 |
| FR | 2 749 397 | 12/1997 |
| GB | 2 029 586 | 3/1980 |
| GB | 2 088 159 A | 6/1982 |
| GB | 2 246 916 A | 10/1990 |
| GB | 2 275 783 A | 7/1994 |
| GB | 2 387 235 A | 10/2003 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04095788 | 3/1992 |
| JP | 04131779 | 5/1992 |
| JP | 04372536 | 12/1992 |
| JP | 05211724 A | 8/1993 |
| JP | 5216550 | 8/1993 |
| JP | 7-128414 | 5/1995 |
| JP | 09061505 | 3/1997 |
| JP | 10056744 | 2/1998 |
| JP | 10232273 | 9/1998 |
| JP | 11103503 A | 4/1999 |
| JP | 11-150809 | 6/1999 |
| JP | 2001057711 A | 2/2001 |
| JP | 2006331976 A | 12/2006 |
| RU | 2089015 C1 | 8/1997 |
| WO | WO 93/22666 | 11/1993 |
| WO | WO 94/05069 | 3/1994 |
| WO | WO 96/01456 | 1/1996 |
| WO | WO 96/06747 | 3/1996 |
| WO | WO 96/28846 | 9/1996 |
| WO | WO 97/01103 | 1/1997 |
| WO | WO 97/44652 | 11/1997 |
| WO | WO 98/04910 | 2/1998 |
| WO | WO 98/21132 | 5/1998 |
| WO | WO 98/58270 | 12/1998 |
| WO | WO 99/23738 | 5/1999 |
| WO | WO 99/56121 | 11/1999 |
| WO | WO 00/16083 | 3/2000 |
| WO | WO 00/62049 | 10/2000 |
| WO | WO 00/67359 | 11/2000 |
| WO | WO 01/59443 | 2/2001 |
| WO | WO 01/16614 | 3/2001 |
| WO | WO 01/16615 | 3/2001 |
| WO | WO 01/51947 | 7/2001 |
| WO | WO 03/047064 A3 | 6/2003 |
| WO | WO 03/076960 A1 | 9/2003 |
| WO | WO 2004/047215 A1 | 6/2004 |

OTHER PUBLICATIONS

Search Report and Written Opinion from PCT Application No. PCT/US2011/038279, dated Sep. 16, 2011, 12 pgs.
"Electrochemical Impedance Spectroscopy in Battery Development and Testing", *Batteries International*, Apr. 1997, pp. 59 and 62-63.
"Battery Impedance", by E. Willihnganz et al., *Electrical Engineering*, Sep. 1959, pp. 922-925.
"Determining the End of Battery Life", by S. DeBardelaben, *IEEE*, 1986, pp. 365-368.
"A Look at the Impedance of a Cell", by S. Debardelaben, *IEEE*, 1988, pp. 394-397.
"The Impedance of Electrical Storage Cells", by N. A. Hampson et al., *Journal of Applied Electrochemistry*, 1980, pp. 3-11.
"A Package for Impedance/Admittance Data Analysis", by B. Boukamp, *Solid State Ionics*, 1986, pp. 136-140.
"Precision of Impedance Spectroscopy Estimates of Bulk, Reaction Rate, and Diffusion Parameters", by J. Macdonald et al., *J. Electroanal, Chem.*, 1991, pp. 1-11.
Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.
IEEE Recommended Practice for Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.
"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.
"JIS Japanese Industrial Standard-Lead Acid Batteries for Automobiles", *Japanese Standards Association UDC*, 621.355.2:629.113. 006, Nov. 1995.
"Performance of Dry Cells", by C. Hambuechen, Preprint of *Am. Electrochem. Soc.*, Apr. 18-20, 1912, paper No. 19, pp. 1-5.
"A Bridge for Measuring Storage Battery Resistance", by E. Wilihncanz, *The Electrochemical Society*, preprint 79-20, Apr. 1941, pp. 253-258.
National Semiconductor Corporation, "High Q Notch Filter", Mar. 1969, Linear Brief 5.
Burr-Brown Corporation, "Design a 60 Hz Notch Filter with the UAF42", Jan. 1994, AB-071.
National Semiconductor Corporation, "LMF90-$4^{th}$-Order Elliptic Notch Filter", Dec. 1994, RRD-B30M115.
"Alligator Clips with Wire Penetrators" *J.S. Popper, Inc.* product information, downloaded from http://www.jspopper.com/, prior to Oct. 1, 2002.
"#12: LM78S40 Simple Switcher DC to DC Converter", *ITM e-Catalog*, downloaded from http://www.pcbcafe.com, prior to Oct. 1, 2002.
"Simple DC-DC Converts Allows Use of Single Battery", *Electronix Express*, downloaded from http://www.elexp.com/t_dc-dc.htm, prior to Oct. 1, 2002.
"DC-DC Converter Basics", *Power Designers*, downloaded from http://www.powederdesigners.com/InforWeb.design_center/articles/DC-DC/converter.shtm, prior to Oct. 1, 2002.
"Notification of Transmittal of The International Search Report or the Declaration", PCT/US02/29461.
"Notification of Transmittal of The International Search Report or the Declaration", PCT/US03/07546.
"Notification of Transmittal of The International Search Report or the Declaration", PCT/US03/06577.

(56) References Cited

OTHER PUBLICATIONS

"Notification of Transmittal of The International Search Report or the Declaration", PCT/US03/07837.
"Improved Impedance Spectroscopy Technique for Status Determination of Production $Li/SO_2$ Batteries" Terrill Atwater et al., pp. 10-113, (1992).
"Notification of Transmittal of The International Search Report or the Declaration", PCT/US03/41561.
"Notification of Transmittal of The International Search Report or the Declaration", PCT/US03/27696.
"Programming Training Course, 62-000 Series Smart Engine Analyzer", Testproducts Division, Kalamazoo, Michigan, pp. 1-207, (1984).
"Operators Manual, Modular Computer Analyzer Model MCA 3000", Sun Electric Corporation, Crystal Lake, Illinois, pp. 1-1-14-13, (1991).
Supplementary European Search Report Communication for Appl. No. 99917402.2; Sep. 7, 2004.
"Dynamic modelling of lead/acid batteries using impedance spectroscopy for parameter identification", Journal of Power Sources, pp. 69-84, (1997).
Notification of Transmittal of the International Search Report for PCT/US03/30707.
"A review of impedance measurements for determination of the state-of-charge or state-of-health of secondary batteries", Journal of Power Sources, pp. 59-69, (1998).
"Search Report Under Section 17" for Great Britain Application No. GB0421447.4.
"Results of Discrete Frequency Immittance Spectroscopy (DFIS) Measurements of Lead Acid Batteries", by K.S. Champlin et al., *Proceedings of 23rd International Teleco Conference (INTELEC)*, published Oct. 2001, IEE, pp. 433-440.
"Examination Report" from the UK Patent Office for App. No. 0417678.0; Jan. 24, 2005.
Wikipedia Online Encyclopedia, Inductance, 2005, http://en.wikipedia.org/wiki/inductance, pp. 1-5, mutual Inductance, pp. 3,4.
"Professional BCS System Analyzer Battery-Charger-Starting", pp. 2-8, (2001).
Young Illustrated Encyclopedia Dictionary of Electronics, 1981, Parker Publishing Company, Inc., pp. 318-319.
Office Action from U.S. Appl. No. 11/352,945; dated Jan. 5, 2007.
Office Action from U.S. Appl. No. 11/146,608 dated May 13, 2008.
Office Action from U.S. Appl. No. 11/063,247 dated Apr. 11, 2008.
"DSP Applications in Hybrid Electric Vehicle Powertrain", Miller et al., Proceedings of the American Control Conference, Sand Diego, CA, Jun. 1999; 2 ppg.
"Notification of Transmittal of the International Search Report and the Written Opinion of the International Searching Authority, or the Declaration" for PCT/US2008/008702 filed Jul. 2008; 15 pages.
"Notification Concerning Availability of the Publication of the International Application" for PCT/US2008/008702, filed Jul. 17, 2008; 24 pages.
"A Microprocessor-Based Control System for a Near-Term Electric Vehicle", Bimal K. Bose; IEEE Transactions on Industry Applications, vol. IA-17, No. 6, Nov./Dec. 198?,; 0093-9994/81/1100-0626$00.75 © 1981 IEEE, 6 pages.
"First Notice Informing the Applicant of the Communication of the International Application (to Designated Offices which do not apply the 30 Month Time Limit Under Article 22(1))" for PCT/US2008/008702 filed Jul. 17, 2008; one page.
"Notification of the Recording of a Change" for PCT/US2008/008702 filed Jul. 17, 2008; one page.
Non-Final Office Action from U.S. Appl. No. 11/356,443, dated Oct. 18, 2007.
Non-Final Office Action from U.S. Appl. No. 11/356,443, dated Apr. 17, 2008.
Non-Final Office Action from U.S. Appl. No. 11/356,443, dated Jun. 5, 2009.
Final Office Action from U.S. Appl. No. 11/356,443, dated Nov. 24, 2009.
"Field Evaluation of Honda's EV PLUS Battery Packs", by A. Paryani, *IEEE AES Systems Magazine*, Nov. 2000, pp. 21-24.
US Office Action from U.S. Appl. No. 08/962,754, dated Apr. 15, 1999.
Office Action from U.S. Appl. No. 08/962,754, dated Aug. 17, 1999.
Search Report from PCT/US2011/047354, dated Nov. 11, 2011.
Written Opinion from PCT/US2011/047354, dated Nov. 11, 2011.
First Office Action (Notification of Reasons for Rejections) dated Dec. 3, 2013 in related Japanese patent application No. 2013-513370, 9 pgs. Including English Translation.
Official Action dated Jan. 22, 2014 in Korean patent application No. 10-2012-7033020, 2 pgs including English Translation.
Official Action dated Feb. 20, 2014 in Korean patent application No. 10-2013-7004814, 6 pgs. including English Translation.
US Office Action from U.S. Appl. No. 09/564,740, dated Mar. 28, 2001.
US Office Action from U.S. Appl. No. 10/046,659, dated Jun. 18, 2003.
US Office Action from U.S. Appl. No. 10/093,853, dated Dec. 31, 2003.
US Office Action from U.S. Appl. No. 10/914,304, dated Jan. 24, 2005.
US Office Action from U.S. Appl. No. 10/914,304, dated Jun. 1, 2005.
Notification of Transmittal of the International Search Report and the Written Opinion of the International Searching Authority, or the Declaration for PCT/US2011/038279 filed May 27, 2011, date of mailing Sep. 16, 2011, 12 pages.
U.S. Appl. No. 60/387,912, filed Jun. 13, 2002 which is related to U.S. Patent No. 7,089,127.
"Conductance Testing Compared to Traditional Methods of Evaluating the Capacity of Valve-Regulated Lead-Acid Batteries and Predicting State-of-Health", by D. Feder et al., May 1992, pp. 1-8; (13 total pgs.).
"Field and Laboratory Studies to Assess the State of Health of Valve-Regulated Lead Acid Batteries : Part I-Conductance/Capacity Correlation Studies", by D. Feder at al., Oct. 1992, pp. 1-15; (19 total pgs.).
"Field Application of Conductance Measurements Use to Ascertain Cell/Battery and Inter-Cell Connection State-of-Health in Electric Power Utility Applications", by M. Hlavac et al., Apr. 1993, pp. 1-14; (19 total pgs.).
"Conductance Testing of Standby Batteries in Signaling and Communications Applications for the Purpose of Evaluating Battery State-of-Health", by S. McShane, Apr. 1993, pp. 1-9; (14 total pgs.).
"Condutance Monitoring of Recombination Lead Acid Batteries", by B. Jones, May 1993, pp. 1-6; (11 total pgs.).
"Evaluating the State-of-Health of Lead Acid Flooded and Valve-Regulated Batteries : A Comparison of Conductance Testing vs. Traditional Methods", by M. Hlavac et al., Jun. 1993, pp. 1-15; (20 total pgs.).
"Updated State of Conductance/Capacity Correlation Studies to Determine the State-of-Health of Automotive SLI and Standby Lead Acid Batteries", by D. Feder et al., Sep. 1993, pp. 1-17; (22 total pgs.).
"Field and Laboratory Studies to Access the State-of-Health of Valve-Regulated Lead-Acid Battery Technologies Using Conductance Testing Part II-Further Conductance/Capacity Correlation Studies", by M. Hlavac et al., Sep. 1993, pp. 1-9; (14 total pgs.).
"Field Experience of Testing VRLA Batteries by Measuring Conductance", by M.W. Kniveton, May 1994, pp. 1-4; (9 total pgs.).
"Reducing the Cost of Maintaining VRLA Batteries in Telecom Applications", by M.W. Kniveton, Sep. 1994, pp. 1-5; (10 total pgs.).
"Analysis and Interpretation of Conductance Measurements used to Access the State-of-Health of Valve Regulated Lead Acid Batteries Part III: Analytical Techniques", by M. Hlavac, Nov. 1994, 9 pgs; (13 total pgs.).
"Testing 24 Volt Aircraft Batteries Using Midtronics Conductance Technology", by M. Hlavac et al., Jan. 1995, 9 pgs; (13 total pgs.).
"VRLA Battery Monitoring Using Conductance Technology Part IV: On-Line State-of-Health Monitoring and Thermal Runaway Detection/Prevention", by M. Hlavac et al., Oct. 1995, 9 pgs; (13 total pgs.).

(56) References Cited

OTHER PUBLICATIONS

"VRLA Battery Conductance Monitoring Part V: Strategies for VRLA Battery Testing and Monitoring in Telecom Operating Environments", by M. Hlavac et al., Oct. 1996, 9 pgs; (13 total pgs.).

"Midpoint Conductance Technology Used in Telecommunication Stationary Standby Battery Applications Part VI: Considerations for Deployment of Midpoint Conductance in Telecommunications Power Applications", by M. Troy et al., Oct. 1997, 9 pgs; (13 total pgs.).

"Impedance/Conductance Measurements as an Aid to Determining Replacement Strategies", M. Kniveton, Sep. 1998, pp. 297-301; (9 total pgs.).

"A Fundamentally New Approach to Battery Performance Analysis Using DFRA™/DTIS™ Technology", by K. Champlin et al., Sep. 2000, 8 pgs; (12 total pgs.).

"Battery State of Health Monitoring, Combining Conductance Technology With Other Measurement Parameters for Real-Time Battery Performance Analysis", by D. Cox et la., Mar. 2000, 6 pgs; (10 total pgs.).

Examination Report under section 18(3) for corresponding Great Britain Application No. GB1000773.0, dated Feb. 6, 2012, 2 pages.
Notification of Transmittal of the International Search Report and Written Opinion from PCT/US2011/039043, dated Jul. 26, 2012.
Notification of Transmittal of the International Search Report and Written Opinion from PCT/US2011/053886, dated Jul. 27, 2012.
Communication from GB1216105.5, dated Sep. 21, 2012.
Office Action for U.S. Appl. No. 11/356,443 mailed on Oct. 18, 2007.
Office Action for U.S. Appl. No. 11/356,443 mailed on Apr. 17, 2008.
Office Action for U.S. Appl. No. 11/356,443 mailed on Jun. 5, 2009.
Office Action for U.S. Appl. No. 12/263,539 mailed on Aug. 20, 2009.
Final Office Action for U.S. Appl. No. 11/356,443 mailed on Nov. 24, 2009.
First Office Action for Chinese Patent Application No. 201180011597.4, dated May 6, 2014, 20 pages.
Office Action from Korean Application No. 10/2012-7033020, dated Jul. 29, 2014.
Office Action for Chinese Patent Application No. 201180038844.X, dated Jul. 1, 2014.

* cited by examiner

ELECTRONIC BATTERY TESTER WITH NETWORK COMMUNICATION

The present application is a Continuation-In-Part of Ser. No. 11/356,443, filed Feb. 16, 2006, which is a Continuation of U.S. Ser. No. 10/914,304, filed Aug. 9, 2004, now U.S. Pat. No. 7,003,411, which is a Divisional of U.S. Ser. No. 10/093,853, filed Mar. 7, 2002, now U.S. Pat. No. 6,871,151, which is a of U.S. Ser. No. 10/046,659, filed Oct. 29, 2001, now U.S. Pat. No. 6,909,287, which is a Divisional of Ser. No. 09/564,740, filed May 4, 2000, now U.S. Pat. No. 6,331,762, which claims priority to Provisional Application Ser. No. 60/132,622, filed May 5, 1999, U.S. Provisional Application No. 60/165,208, filed Nov. 12, 1999, and Provisional Application Ser. No. 60/175,762, filed Jan. 12, 2000, application Ser. No. 10/046,659 is also a Continuation-In-Part of application Ser. No. 09/575,627, filed May 22, 2000, now U.S. Pat. No. 6,313,608, which is a Continuation-In-Part of application Ser. No. 08/962,754, filed Nov. 3, 1997, now U.S. Pat. No. 6,081,098, the contents of which are hereby incorporated by reference in their entirety.

BACKGROUND OF THE INVENTION

The present invention relates to electronic battery testers of the type used to perform tests on storage batteries.

Electronic battery testers are used to test and determine the condition of storage batteries. Examples of electronic battery testers and related technologies are shown in U.S. Pat. No. 3,873,911, issued Mar. 25, 1975, to Champlin; U.S. Pat. No. 3,909,708, issued Sep. 30, 1975, to Champlin; U.S. Pat. No. 4,816,768, issued Mar. 28, 1989, to Champlin; U.S. Pat. No. 4,825,170, issued Apr. 25, 1989, to Champlin; U.S. Pat. No. 4,881,038, issued Nov. 14, 1989, to Champlin; U.S. Pat. No. 4,912,416, issued Mar. 27, 1990, to Champlin; U.S. Pat. No. 5,140,269, issued Aug. 18, 1992, to Champlin; U.S. Pat. No. 5,343,380, issued Aug. 30, 1994; U.S. Pat. No. 5,572,136, issued Nov. 5, 1996; U.S. Pat. No. 5,574,355, issued Nov. 12, 1996; U.S. Pat. No. 5,583,416, issued Dec. 10, 1996; U.S. Pat. No. 5,585,728, issued Dec. 17, 1996; U.S. Pat. No. 5,589,757, issued Dec. 31, 1996; U.S. Pat. No. 5,592,093, issued Jan. 7, 1997; U.S. Pat. No. 5,598,098, issued Jan. 28, 1997; U.S. Pat. No. 5,656,920, issued Aug. 12, 1997; U.S. Pat. No. 5,757,192, issued May 26, 1998; U.S. Pat. No. 5,821,756, issued Oct. 13, 1998; U.S. Pat. No. 5,831,435, issued Nov. 3, 1998; U.S. Pat. No. 5,871,858, issued Feb. 16, 1999; U.S. Pat. No. 5,914,605, issued Jun. 22, 1999; U.S. Pat. No. 5,945,829, issued Aug. 31, 1999; U.S. Pat. No. 6,002,238, issued Dec. 14, 1999; U.S. Pat. No. 6,037,751, issued Mar. 14, 2000; U.S. Pat. No. 6,037,777, issued Mar. 14, 2000; U.S. Pat. No. 6,051,976, issued Apr. 18, 2000; U.S. Pat. No. 6,081,098, issued Jun. 27, 2000; U.S. Pat. No. 6,091,245, issued Jul. 18, 2000; U.S. Pat. No. 6,104,167, issued Aug. 15, 2000; U.S. Pat. No. 6,137,269, issued Oct. 24, 2000; U.S. Pat. No. 6,163,156, issued Dec. 19, 2000; U.S. Pat. No. 6,172,483, issued Jan. 9, 2001; U.S. Pat. No. 6,172,505, issued Jan. 9, 2001; U.S. Pat. No. 6,222,369, issued Apr. 24, 2001; U.S. Pat. No. 6,225,808, issued May 1, 2001; U.S. Pat. No. 6,249,124, issued Jun. 19, 2001; U.S. Pat. No. 6,259,254, issued Jul. 10, 2001; U.S. Pat. No. 6,262,563, issued Jul. 17, 2001; U.S. Pat. No. 6,294,896, issued Sep. 25, 2001; U.S. Pat. No. 6,294,897, issued Sep. 25, 2001; U.S. Pat. No. 6,304,087, issued Oct. 16, 2001; U.S. Pat. No. 6,310,481, issued Oct. 30, 2001; U.S. Pat. No. 6,313,607, issued Nov. 6, 2001; U.S. Pat. No. 6,313,608, issued Nov. 6, 2001; U.S. Pat. No. 6,316,914, issued Nov. 13, 2001; U.S. Pat. No. 6,323,650, issued Nov. 27, 2001; U.S. Pat. No. 6,329,793, issued Dec. 11, 2001; U.S. Pat. No. 6,331,762, issued Dec. 18, 2001; U.S. Pat. No. 6,332,113, issued Dec. 18, 2001; U.S. Pat. No. 6,351,102, issued Feb. 26, 2002; U.S. Pat. No. 6,359,441, issued Mar. 19, 2002; U.S. Pat. No. 6,363,303, issued Mar. 26, 2002; U.S. Pat. No. 6,377,031, issued Apr. 23, 2002; U.S. Pat. No. 6,392,414, issued May 21, 2002; U.S. Pat. No. 6,417,669, issued Jul. 9, 2002; U.S. Pat. No. 6,424,158, issued Jul. 23, 2002; U.S. Pat. No. 6,441,585, issued Aug. 17, 2002; U.S. Pat. No. 6,437,957, issued Aug. 20, 2002; U.S. Pat. No. 6,445,158, issued Sep. 3, 2002; U.S. Pat. No. 6,456,045; U.S. Pat. No. 6,466,025, issued Oct. 15, 2002; U.S. Pat. No. 6,465,908, issued Oct. 15, 2002; U.S. Pat. No. 6,466,026, issued Oct. 15, 2002; U.S. Pat. No. 6,469,511, issued Nov. 22, 2002; U.S. Pat. No. 6,495,990, issued Dec. 17, 2002; U.S. Pat. No. 6,497,209, issued Dec. 24, 2002; U.S. Pat. No. 6,507,196, issued Jan. 14, 2003; U.S. Pat. No. 6,534,993; issued Mar. 18, 2003; U.S. Pat. No. 6,544,078, issued Apr. 8, 2003; U.S. Pat. No. 6,556,019, issued Apr. 29, 2003; U.S. Pat. No. 6,566,883, issued May 20, 2003; U.S. Pat. No. 6,586,941, issued Jul. 1, 2003; U.S. Pat. No. 6,597,150, issued Jul. 22, 2003; U.S. Pat. No. 6,621,272, issued Sep. 16, 2003; U.S. Pat. No. 6,623,314, issued Sep. 23, 2003; U.S. Pat. No. 6,633,165, issued Oct. 14, 2003; U.S. Pat. No. 6,635,974, issued Oct. 21, 2003; U.S. Pat. No. 6,707,303, issued Mar. 16, 2004; U.S. Pat. No. 6,737,831, issued May 18, 2004; U.S. Pat. No. 6,744,149, issued Jun. 1, 2004; U.S. Pat. No. 6,759,849, issued Jul. 6, 2004; U.S. Pat. No. 6,781,382, issued Aug. 24, 2004; U.S. Pat. No. 6,788,025, filed Sep. 7, 2004; U.S. Pat. No. 6,795,782, issued Sep. 21, 2004; U.S. Pat. No. 6,805,090, filed Oct. 19, 2004; U.S. Pat. No. 6,806,716, filed Oct. 19, 2004; U.S. Pat. No. 6,850,037, filed Feb. 1, 2005; U.S. Pat. No. 6,850,037, issued Feb. 1, 2005; U.S. Pat. No. 6,871,151, issued Mar. 22, 2005; U.S. Pat. No. 6,885,195, issued Apr. 26, 2005; U.S. Pat. No. 6,888,468, issued May 3, 2005; U.S. Pat. No. 6,891,378, issued May 10, 2005; U.S. Pat. No. 6,906,522, issued Jun. 14, 2005; U.S. Pat. No. 6,906,523, issued Jun. 14, 2005; U.S. Pat. No. 6,909,287, issued Jun. 21, 2005; U.S. Pat. No. 6,914,413, issued Jul. 5, 2005; U.S. Pat. No. 6,913,483, issued Jul. 5, 2005; U.S. Pat. No. 6,930,485, issued Aug. 16, 2005; U.S. Pat. No. 6,933,727, issued Aug. 23, 200; U.S. Pat. No. 6,941,234, filed Sep. 6, 2005; U.S. Pat. No. 6,967,484, issued Nov. 22, 2005; U.S. Pat. No. 6,998,847, issued Feb. 14, 2006; U.S. Pat. No. 7,003,410, issued Feb. 21, 2006; U.S. Pat. No. 7,003,411, issued Feb. 21, 2006; U.S. Pat. No. 7,012,433, issued Mar. 14, 2006; U.S. Pat. No. 7,015,674, issued Mar. 21, 2006; U.S. Pat. No. 7,034,541, issued Apr. 25, 2006; U.S. Pat. No. 7,039,533, issued May 2, 2006; U.S. Pat. No. 7,058,525, issued Jun. 6, 2006; U.S. Pat. No. 7,081,755, issued Jul. 25, 2006; U.S. Pat. No. 7,106,070, issued Sep. 12, 2006; U.S. Pat. No. 7,116,109, issued Oct. 3, 2006; U.S. Pat. No. 7,119,686, issued Oct. 10, 2006; and U.S. Pat. No. 7,126,341, issued Oct. 24, 2006; U.S. Pat. No. 7,154,276, issued Dec. 26, 2006; U.S. Pat. No. 7,198,510, issued Apr. 3, 2007; U.S. Pat. No. 7,363,175, issued Apr. 22, 2008; U.S. Pat. No. 7,208,914, issued Apr. 24, 2007; U.S. Pat. No. 7,246,015, issued Jul. 17, 2007; U.S. Pat. No. 7,295,936, issued Nov. 13, 2007; U.S. Pat. No. 7,319,304, issued Jan. 15, 2008; U.S. Pat. No. 7,363,175, issued Apr. 22, 2008; U.S. Pat. No. 7,398,176, issued Jul. 8, 2008; U.S. Pat. No. 7,408,358, issued Aug. 5, 2008; U.S. Pat. No. 7,425,833, issued Sep. 16, 2008; U.S. Pat. No. 7,446,536, issued Nov. 4, 2008; U.S. Pat. No. 7,479,763, issued Jan. 20, 2009; U.S. Pat. No. 7,498,767, issued Mar. 3, 2009; U.S. Pat. No. 7,501,795, issued Mar. 10, 2009; U.S. Pat. No. 7,505,856, issued Mar. 17, 2009; U.S. Pat. No. 7,545,146, issued Jun. 9, 2009; U.S. Pat. No. 7,557,586, issued Jul. 7, 2009; U.S. Pat. No. 7,595,643, issued Sep. 29, 2009; U.S. Pat. No. 7,598,699, issued Oct. 6, 2009; U.S. Pat. No. 7,598,744, issued Oct. 6, 2009; U.S. Pat. No. 7,598,743, issued Oct. 6, 2009; U.S. Pat. No.

7,619,417, issued Nov. 17, 2009; U.S. Pat. No. 7,642,786, issued Jan. 5, 2010; U.S. Pat. No. 7,642,787, issued Jan. 5, 2010; U.S. Pat. No. 7,656,162, issued Feb. 2, 2010; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/880,473, filed Jun. 13, 2001; entitled BATTERY TEST MODULE; U.S. Ser. No. 10/042,451, filed Jan. 8, 2002, entitled BATTERY CHARGE CONTROL DEVICE; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/112,998, filed Mar. 29, 2002, entitled BATTERY TESTER WITH BATTERY REPLACEMENT OUTPUT; U.S. Ser. No. 10/263,473, filed Oct. 2, 2002, entitled ELECTRONIC BATTERY TESTER WITH RELATIVE TEST OUTPUT; U.S. Ser. No. 10/310,385, filed Dec. 5, 2002, entitled BATTERY TEST MODULE; U.S. Ser. No. 10/653,342, filed Sep. 2, 2003, entitled ELECTRONIC BATTERY TESTER CONFIGURED TO PREDICT A LOAD TEST RESULT; U.S. Ser. No. 09/653,963, filed Sep. 1, 2000, entitled SYSTEM AND METHOD FOR CONTROLLING POWER GENERATION AND STORAGE; U.S. Ser. No. 10/174,110, filed Jun. 18, 2002, entitled DAYTIME RUNNING LIGHT CONTROL USING AN INTELLIGENT POWER MANAGEMENT SYSTEM; U.S. Ser. No. 10/258,441, filed Apr. 9, 2003, entitled CURRENT MEASURING CIRCUIT SUITED FOR BATTERIES; U.S. Ser. No. 10/681,666, filed Oct. 8, 2003, entitled ELECTRONIC BATTERY TESTER WITH PROBE LIGHT; U.S. Ser. No. 10/791,141, filed Mar. 2, 2004, entitled METHOD AND APPARATUS FOR AUDITING A BATTERY TEST; U.S. Ser. No. 10/867,385, filed Jun. 14, 2004, entitled ENERGY MANAGEMENT SYSTEM FOR AUTOMOTIVE VEHICLE; U.S. Ser. No. 10/958,812, filed Oct. 5, 2004, entitled SCAN TOOL FOR ELECTRONIC BATTERY TESTER; U.S. Ser. No. 60/587,232, filed Dec. 14, 2004, entitled CELLTRON ULTRA, U.S. Ser. No. 11/018,785, filed Dec. 21, 2004, entitled WIRELESS BATTERY MONITOR; U.S. Ser. No. 60/653,537, filed Feb. 16, 2005, entitled CUSTOMER MANAGED WARRANTY CODE; U.S. Ser. No. 60/665,070, filed Mar. 24, 2005, entitled OHMMETER PROTECTION CIRCUIT; U.S. Ser. No. 60,694,199, filed Jun. 27, 2005, entitled GEL BATTERY CONDUCTANCE COMPENSATION; U.S. Ser. No. 11/178,550, filed Jul. 11, 2005, entitled WIRELESS BATTERY TESTER/CHARGER; U.S. Ser. No. 60/705,389, filed Aug. 4, 2005, entitled PORTABLE TOOL THEFT PREVENTION SYSTEM, U.S. Ser. No. 11/207,419, filed Aug. 19, 2005, entitled SYSTEM FOR AUTOMATICALLY GATHERING BATTERY INFORMATION FOR USE DURING BATTERY TESTER/CHARGING, U.S. Ser. No. 60/712,322, filed Aug. 29, 2005, entitled AUTOMOTIVE VEHICLE ELECTRICAL SYSTEM DIAGNOSTIC DEVICE, U.S. Ser. No. 60/713,168, filed Aug. 31, 2005, entitled LOAD TESTER SIMULATION WITH DISCHARGE COMPENSATION, U.S. Ser. No. 60/731,881, filed Oct. 31, 2005, entitled PLUG-IN FEATURES FOR BATTERY TESTERS; U.S. Ser. No. 60/731,887, filed Oct. 31, 2005, entitled AUTOMOTIVE VEHICLE ELECTRICAL SYSTEM DIAGNOSTIC DEVICE; U.S. Ser. No. 11/304,004, filed Dec. 14, 2005, entitled BATTERY TESTER THAT CALCULATES ITS OWN REFERENCE VALUES; U.S. Ser. No. 60/751,853, filed Dec. 20, 2005, entitled BATTERY MONITORING SYSTEM; U.S. Ser. No. 11/304,004, filed Dec. 14, 2005, entitled BATTERY TESTER WITH CALCULATES ITS OWN REFERENCE VALUES; U.S. Ser. No. 60/751,853, filed Dec. 20, 2005, entitled BATTERY MONITORING SYSTEM; U.S. Ser. No. 11/356,443, filed Feb. 16, 2006, entitled ELECTRONIC BATTERY TESTER WITH NETWORK COMMUNICATION; U.S. Ser. No. 11/498,703, filed Aug. 3, 2006, entitled THEFT PREVENTION DEVICE FOR AUTOMOTIVE VEHICLE SERVICE CENTERS; U.S. Ser. No. 11/511,872, filed Aug. 29, 2006, entitled AUTOMOTIVE VEHICLE ELECTRICAL SYSTEM DIAGNOSTIC DEVICE; U.S. Ser. No. 11/519,481, filed Sep. 12, 2006, entitled BROAD-BAND LOW-CONDUCTANCE CABLES FOR MAKING KELVIN CONNECTIONS TO ELECTROCHEMICAL CELLS AND BATTERIES; U.S. Ser. No. 60/847,064, filed Sep. 25, 2006, entitled STATIONARY BATTERY MONITORING ALGORITHMS; U.S. Ser. No. 11/641,594, filed Dec. 19, 2006, entitled METHOD AND APPARATUS FOR MEASURING A PARAMETER OF A VEHICLE ELECTRONIC SYSTEM; U.S. Ser. No. 11/711,356, filed Feb. 27, 2007, entitled BATTERY TESTER WITH PROMOTION FEATURE; U.S. Ser. No. 11/811,528, filed Jun. 11, 2007, entitled ALTERNATOR TESTER; U.S. Ser. No. 60/950,182, filed Jul. 17, 2007, entitled BATTERY TESTER FOR HYBRID VEHICLE; U.S. Ser. No. 60/973,879, filed Sep. 20, 2007, entitled ELECTRONIC BATTERY TESTER FOR TESTING STATIONARY BATTERIES; U.S. Ser. No. 11/931,907, filed Oct. 31, 2007, entitled BATTERY MAINTENANCE WITH PROBE LIGHT; U.S. Ser. No. 60/992,798, filed Dec. 6, 2007, entitled STORAGE BATTERY AND BATTERY TESTER; U.S. Ser. No. 12/099,826, filed Apr. 9, 2008, entitled BATTERY RUN DOWN INDICATOR; U.S. Ser. No. 61/061,848, filed Jun. 16, 2008, entitled KELVIN CLAMP FOR ELECTRONICALLY COUPLING TO A BATTERY CONTACT; U.S. Ser. No. 12/168,264, filed Jul. 7, 2008, entitled BATTERY TESTERS WITH SECONDARY FUNCTIONALITY; U.S. Ser. No. 12/174,894, filed Jul. 17, 2008, entitled BATTERY TESTER FOR ELECTRIC VEHICLE; U.S. Ser. No. 12/204,141, filed Sep. 4, 2008, entitled ELECTRONIC BATTERY TESTER OR CHARGER WITH DATABUS CONNECTION; U.S. Ser. No. 12/328,022, filed Dec. 4, 2008, entitled STORAGE BATTERY AND BATTERY TESTER; U.S. Ser. No. 12/416,457, filed Apr. 1, 2009, entitled SYSTEM FOR AUTOMATICALLY GATHERING BATTERY INFORMATION; U.S. Ser. No. 12/416,453, filed Apr. 1, 2009, entitled INTEGRATED TAG READER AND ENVIRONMENT SENSOR; U.S. Ser. No. 12/416,445, filed Apr. 1, 2009, entitled SIMPLIFICATION OF INVENTORY MANAGEMENT; U.S. Ser. No. 12/485,459, filed Jun. 16, 2009, entitled CLAMP FOR ELECTRONICALLY COUPLING TO A BATTERY CONTACT; U.S. Ser. No. 12/498,642, filed Jul. 7, 2009, entitled ELECTRONIC BATTERY TESTER; U.S. Ser. No. 12/697,485, filed Feb. 1, 2010, entitled ELECTRONIC BATTERY TESTER; U.S. Ser. No. 12/698,375, filed Feb. 2, 2010, entitled ELECTRONIC BATTERY TESTER; U.S. Ser. No. 12/712,456, filed Feb. 25, 2010, entitled METHOD AND APPARATUS FOR DETECTING CELL DETERIORATION IN AN ELECTROCHEMICAL CELL OR BATTERY; U.S. Ser. No. 61/311,485, filed Mar. 8, 2010, entitled BATTERY TESTER WITH DATABUS FOR COMMUNICATING WITH VEHICLE ELECTRICAL SYSTEM U.S. Ser. No. 61/313,893, filed Mar. 15, 2010, entitled USE OF BATTERY MANUFACTURE/SELL DATE IN DIAGNOSIS AND RECOVERY OF DISCHARGED BATTERIES; which are incorporated herein in their entirety.

As storage batteries have found increasing use in various industries, the use of electronic battery testers to test those batteries has expanded. Example uses include batteries for vehicles (with or without internal combustion engines) and batteries for back up power supplies such as those used in telecommunication installations.

To address this increased use, various diagnostic and testing techniques and systems for use with storage batteries have advanced in recent times. However, a typical electronic battery tester simply provides an output which is viewed by a user or technician. The data is used to make a determination regarding the condition and possible need for replacement of a storage battery. Once that determination is made, the output from the battery tester is typically discarded when the battery tester is disconnected.

The increasing use of electronic battery testers has resulted in an increasing number of battery tests which are performed and consequently resulted in an increased amount of data related to storage batteries. However, advantages from this increased amount of data has been largely unrecognized.

SUMMARY OF THE INVENTION

An electronic battery tester for testing a storage battery includes test circuitry configured to couple to the storage battery and provide a battery test output related to a condition of the battery. A memory is configured to store a battery tester address of the battery tester. Communication circuitry transmits the battery test output formatted with the battery tester address on a communication link to a remote location.

DETAILED DESCRIPTION OF THE PREFERRED EMBODIMENTS

The present invention includes the recognition that the output from electronic battery testers can provide useful diagnostic or other information for analysis to a remote location. In one aspect, the present invention includes providing an electronic battery tester with a battery tester address and transmitting the result of a battery test, data recovered the test during or from the battery, or related to the battery test, to a remote location in a manner in which the battery tester address is formatted (i.e., in some way combined or associated with) with the battery test data. This information is transmitted to a remote location for subsequent review or processing. Similarly, the battery tester can receive information when the information is associated with the battery tester address.

Figure 1:
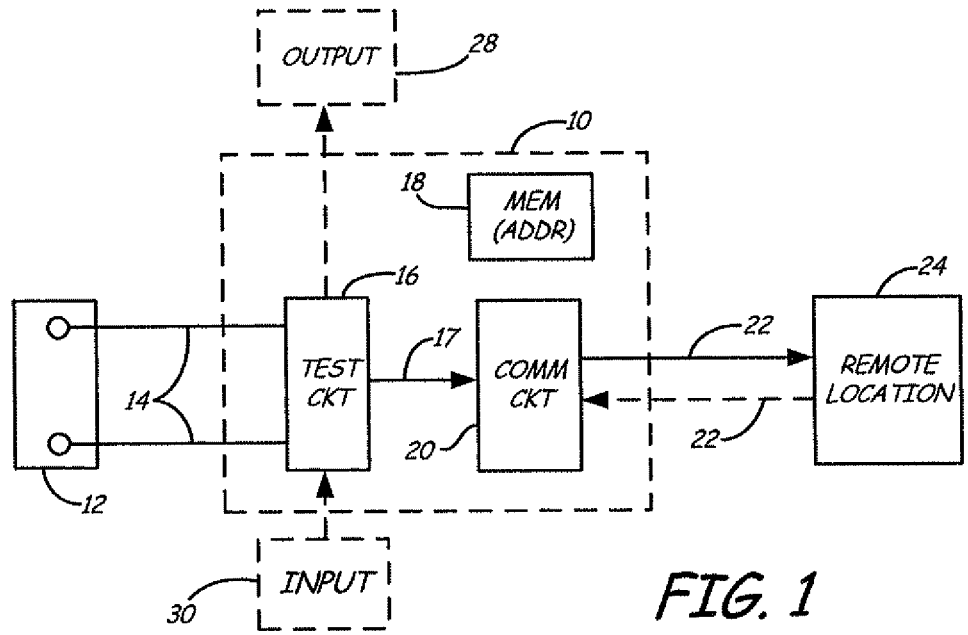
FIG. 1 is a simplified block diagram of a battery tester in accordance with one example embodiment of the present invention.

FIG. 1 is a simplified block diagram showing an electronic battery tester 10 in accordance with one example embodiment of the present invention. Electronic battery tester 10 couples to storage battery 12 through electrical connections 14. In one embodiment, connections 14 are Kelvin connections. However, the invention is not limited to such a configuration. The connection can be any type of connection including non-physical connections and can comprise any number of connections. Electronic battery tester 10 includes test circuitry 16 which is configured to perform a test on battery 12 using any type of known or yet to be discovered battery test and provide a battery test result (or output) 17.

A memory 18 contains a battery tester address associated with the battery tester 10. In some embodiments, the address is not unique. Communication circuitry 20 couples to the test circuitry 16 and the memory 18 and is configured to format information related to the battery test (battery test data) along with the battery tester address on a communication link 22. Link 22 can, for example, couple to a remote location 24. The communication link 22 can operate bi-directionally or in a single direction, carrying data between tester 10 and remote location 24. The link 22 can be a network, such as a computer network. Example network implementations include ethernet, token ring, PPP (point to point protocol), SLIP, or other protocols including proprietary protocols.

FIG. 1 also illustrates an optional output 28 which can be used to provide an output related to the battery test. Similarly, an optional input 30 can be used to input data. For example, the data can relate to the type of battery 12 or be used in the determination of a relative condition of battery 12, for example by receiving a battery rating. The output 28 and the input 30 can be for use by an operator, such as a display and a manual input, or it can be coupled to other equipment. The input 30 and output 28 can be over physical or non-physical connections. The various components of battery tester 10 including output 28 and input 30, can be implemented using any number of components and FIG. 1 is provided to illustrate a simplified block diagram. With microprocessor based circuitry, the various blocks illustrated in FIG. 1 may be implemented in shared components and their physical implementation may not break down into the discrete blocks illustrated in the Figure. The various components can be implemented in hardware, software or their combination.

Figure 2:
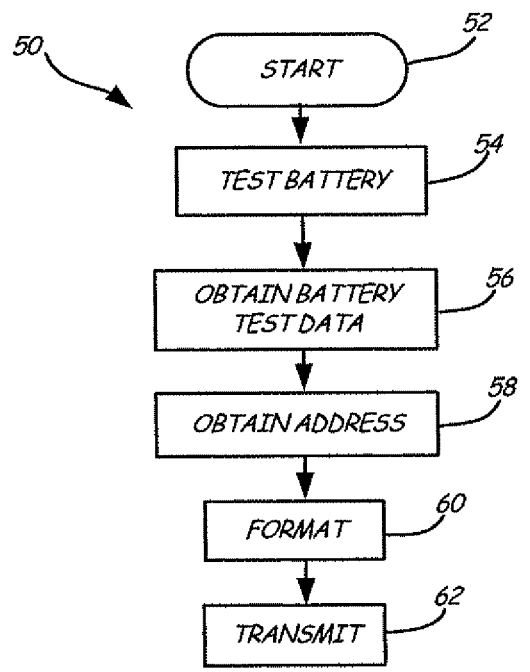
FIG. 2 is a simplified flow chart showing steps in accordance with one example embodiment of the invention.

FIG. 2 is a simplified block diagram 50 showing example steps in accordance with the present invention. The various steps shown in FIG. 2 may be implemented in any order, or wholly or partially in parallel, and are not limited to the particular implementation shown in the Figure. At block 52, the process starts and control is passed to block 54 where the storage battery 12 is tested. At optional block 56, battery test data is obtained. This can be any data which is related to the battery test and may or may not include the battery test result obtained at block 54. At block 58, the address of the battery tester 10 is obtained from memory 18. At block 60, tester 10 formats the battery test data with the battery tester address. The formatted data is transmitted over communication link 22 at block 62.

The battery test performed at block 54 by test circuitry 16 can be any known or yet to be discovered battery test. In one aspect, the battery test is based upon a dynamic measurement, that is a measurement in which a time varying signal is used in performing the battery test. In another example aspect, electrical connections 14 comprise Kelvin connections.

The battery test output 17 can be any type of output from a battery test including a qualitative or a quantitative output. The optional battery test related data can be any type of data related to the battery test including various measurements used in obtaining the battery test output (such as voltages, currents, information related to timing, time periods, signals and waveforms, etc.) or other types of data including temperature (either ambient or some other temperature such as the temperature of battery 12), battery serial number, model number, vehicle identification or serial number, geographic related information, time and/or date information, data which identifies the operator, the steps performed by the operator or the battery test, the vehicle VIN number, data obtained from the vehicle computer or computer system, data related to the architecture of a backup or auxiliary battery site including the equipment, number of battery strings and types of batteries, maintenance related data, etc. The data can be obtained from existing or yet to be implemented vehicle communication bus structures including the CAN bus, J1939, J1850, etc. Other types of data includes bar code information, dealer information, codes such as warranty codes, count information related to how many times or when a particular battery tester was used, information relating to promotions or sales, etc. Additionally, data can be a compilation of data collected over a period of time, either raw data or data which has been analyzed or otherwise used by the battery tester.

Figure 3:
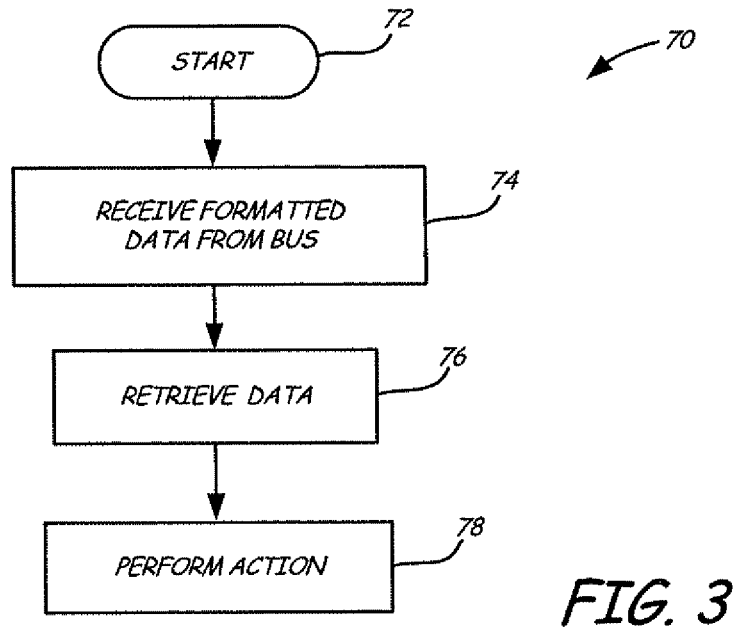
FIG. 3 is a simplified block diagram showing steps associated with retrieving data in accordance with one example embodiment of the invention.

FIG. 3 is a simplified block diagram 70 showing steps associated with the receiving of data by electronic battery tester 10 over communication link 22. The procedure starts at 72 and at block 74 the formatted data is received from bus 22. This formatted data is of a similar format to that discussed in connection with FIG. 2 and contains information along with the address of the electronic battery tester 10. The formatted data is extracted and retrieved at step 76 and some type of action is performed at step 78. The particular type of action can be any type of action including actions in which the retrieved data is acted upon as a function of the retrieved data, stored in memory 18 for future use, immediately displayed or otherwise utilized by battery tester 10, etc.

Communication link 22 is any type of physical or non-physical communication link, or a combination. Examples include electrical wiring, infrared, Radio Frequency (RF), etc. The data carried on communication link 22 can be uni-directional or bi-directional and can be in accordance with any communication protocol. The data carried on communication link can be in an encrypted format in accordance with any encryption technique. In various aspects, the address of battery tester 10 can be a shared address, a locally unique address or a globally unique address.

One example protocol for data on link 22 is the TCP/IP protocol. In such an embodiment, the address of battery tester 10 can be an IP (Internet Protocol) address. For example, RFC791 promulgated by the Internet Engineering Taskforce in September 1981 defines such an address. In one specific example, the address consists of at least four groups of data, each group comprises at least 8 bits.

Data can be sent in response to an event at battery tester 10, at particular times, or in response to polling from remote location 24. If a two-way communication link 22 is used, data and/or programming instructions in tester 10 can be updated as desired and tester 10 can be controlled from a remote location.

Remote location 24 can collect data from one or more battery testers. The data can be placed into a database format for subsequent analysis. For example, statistics of the data can be calculated and used in order to diagnose or research battery failures, sales trends, usage, or other aspects related to battery tests, installation, use and ultimate failure. Additionally, data can be correlated with vehicles, geographical areas, dealers, etc., including how battery testers are being used.

When retrieving data, various types of information can be retrieved by electronic battery tester 10. For example, battery test parameters or test criteria can be automatically updated as can tables or battery ratings. The battery tester software can be updated as desired as new releases become available. Service bulletins related to a particular test, or particular type of battery, particular vehicle or problem associate with a battery or battery test can be provided to the operated or stored in the memory for future use. The test procedures for unusual cars, or tests which are difficult to perform, can be looked up on a remove database. An authorization can be received in which the operator receives an authorization to replace a battery, for example a battery which is under warranty. The authorization can be a function of data contained at a remote location, for example if a particular location has an unusually high rate of warranty returns, a request for authorization to return a battery could be denied, or otherwise identified for subsequent auditing. The battery tester 10 can also take advantage of increased computing power which might be available at a remove location. Data available over the interne can be retrieved for use during the test. For example, weather information or statistics can be obtained for a particular area such that the battery test is modified as function of the current or predicted weather. If a cold period is imminent, for example, a harsher test can be employed. If a battery is replaced, an inventory list can be updated such that a inventory is reordered, for example, by sending an e-mail or other communication to a distributor. If the battery itself has a unique identification, for example a serial number, this information can be used to monitor the battery from "cradle to grave". For example, various tests performed throughout the life of the battery can be utilized to observe trends in the battery test. Further, service alerts or other information can be linked to a battery.

Figure 4:
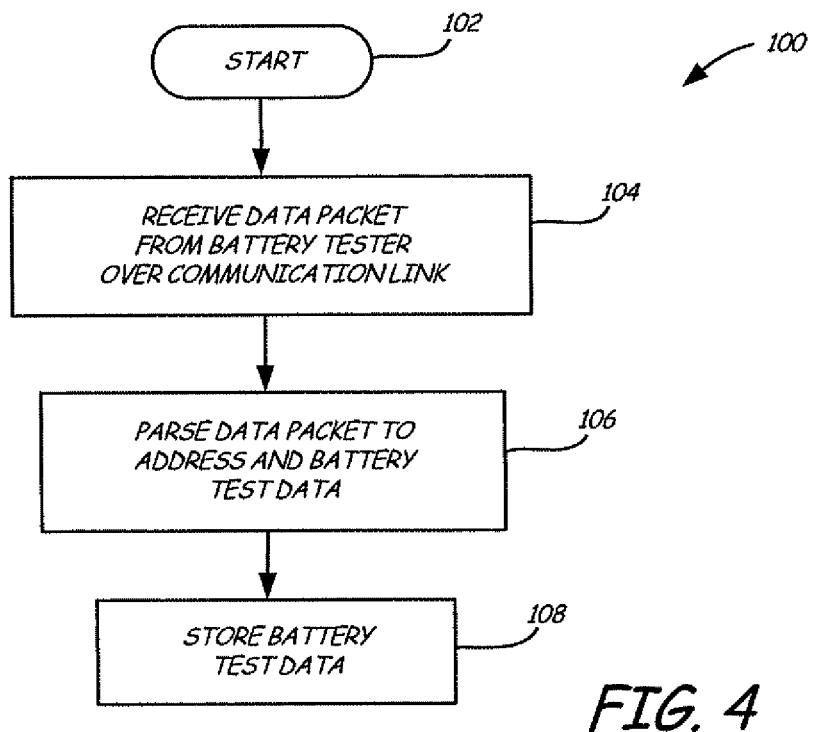
FIG. 4 is a simplified block diagram showing steps in accordance with receiving battery test data.

FIG. 4 is a simplified block diagram 100 showing steps performed in accordance with receiving data from an electronic battery tester in accordance with the present invention. The receiving can be, for example, at a remote manufacturing or management site. At block 102 the procedure starts and control is passed to block 104 where a data pack is received from the electronic battery tester over the communication link. At block 106, the data packet is parsed into the address which identifies the electronic battery tester and the battery test data contained within the data packet. At block 108, the battery test data is stored or otherwise operated upon. Various examples of such operations are discussed above.

Any appropriate type of wireless communication may be used in accordance with the present invention. One specific example is cellular based wireless communication technologies. These include, for example, PCS, GSM, CDMA, AMPS, NAMPS, FDMA, TDMA technologies or others such as "3G" and "4G" and "EDGE". Other communication can comprise analog or digital communication techniques and may be unidirectional or bidirectional including full or half duplex communication. In such a configuration, the address of the battery tester can comprise a numerical representation which identifies a cellular phone on a cellular phone network. Examples include the International Mobile Equipment Identifier (IMEAI) or the Electronic Serial Number (ESN), or a telephone number, etc. This information is stored in a memory which, for example, a NAM (Number Assignment Module), ICCID (Integrated Circuit Card ID), IMSI (International Mobile Subscriber Identifier) or others. The cellular communication can occur between a single or multiple cellular tower antenna contained on a cellular tower, and/or single or multiple antennas carried in orbit on satellites.

Figure 5:
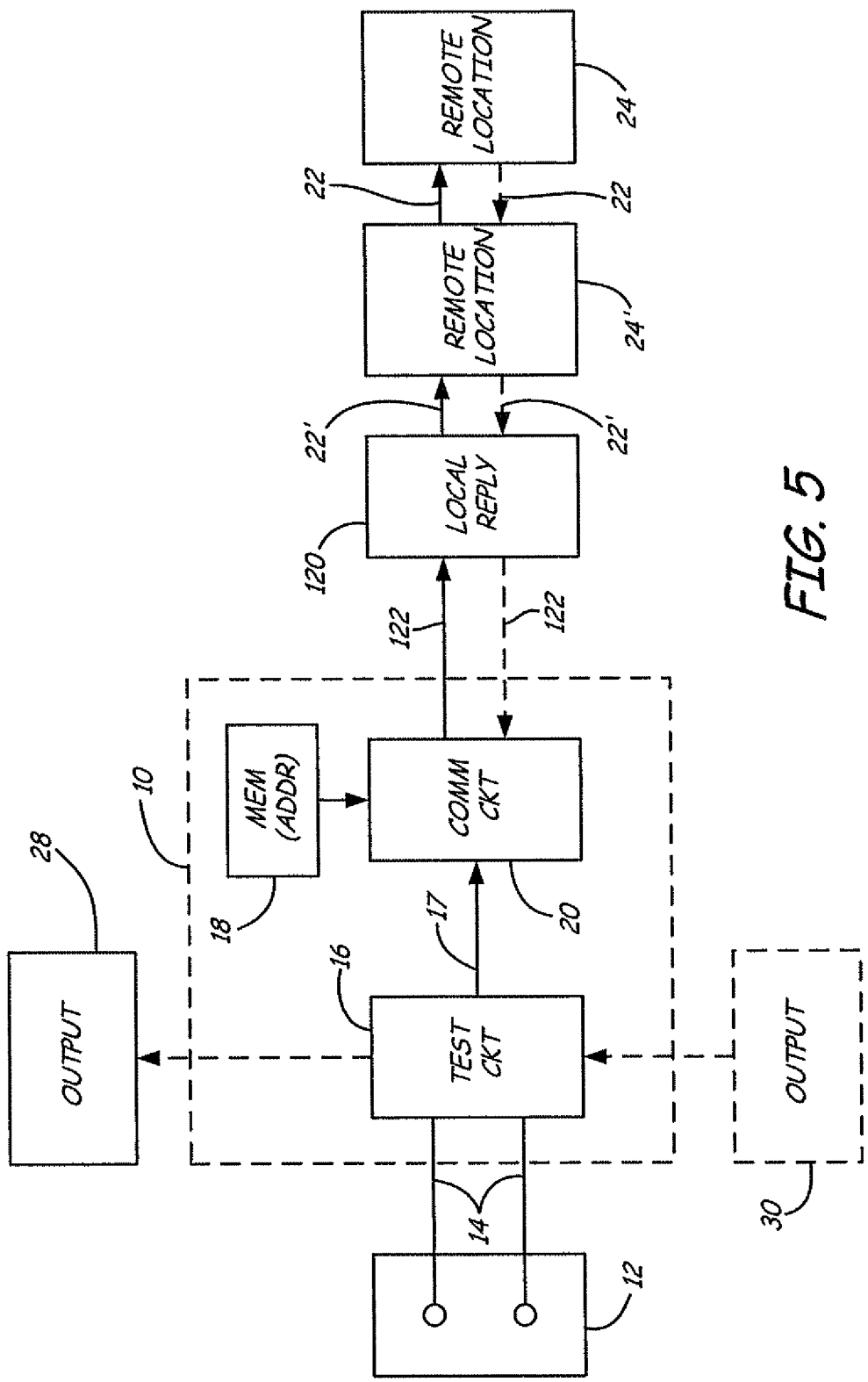
FIG. 5 is a simplified block diagram showing another configuration for communicating information to a remote location.

FIG. 5 is a simplified block diagram similar to FIG. 1 showing a configuration where the communication circuitry communicates with a remote location in which the communication pathway includes an intermediary link. In the configuration of FIG. 5, the communication circuitry 20 communicates with a local relay 120 over an optionally bidirectional communication link 122. Local relay 122 communicates with an optional intermediary remote location 24' over an optionally bidirectional communication link 22'. The communication reaches a final remote location destination 24 over optionally bidirectional communication link 22. Elements 120 and 24' operate as intermediary relays and communicates information with remote location 24. Although only two intermediary relays are shown, any number may be employed.

In one specific example embodiment, local relay 120 comprises, for example, a cellular telephone or other cellular based communication device. In such a configuration, the communication link 122 with battery tester 10 can be in accordance with a local communication technology such as a hardwire connection, for example, USB or the like, or a wireless technology such as BlueTooth® communication technology, WIFI or other. The local relay 120 can then communicate, with for example a cellular telephone site 24' using cellular technology as described above. In one example, the intermediary remote location 24' comprises a cellular tower at a cellular communication site. The remote location 24' can then communicate with an ultimate destination remote location 24 using standard national and international data communication networks such as cellular telephone networks, land line or other hardwire networks, digital communication network, etc.

The local relay 120 can comprise, for example, a "smart phone" which provides additional processing capabilities and is configured to relay information to the remote location 24. In addition to conveying information, the local relay 120 can be used to monitor or control operation of battery tester 10.

Although the present invention has been described with reference to preferred embodiments, workers skilled in the art will recognize that changes may be made in form and detail without departing from the spirit and scope of the invention.

What is claimed is:

1. An electronic battery tester for testing a storage battery, comprising:
   test circuitry configured to couple to the storage battery and provide a battery test output related to a condition of the battery;
   a memory containing a battery tester address associated with the battery tester which identifies the battery tester;
   a local communication link configured to provide communication between the test circuitry and a local relay;
   a remote communication link configured to provide communication between the local relay and a remote location;
   wherein data sent to the remote location includes battery test data and the battery tester address.

2. The apparatus of claim 1 wherein the local relay comprises a cellular telephone.

3. The apparatus of claim 1 wherein the local communication link is in accordance with wireless technology.

4. The apparatus of claim 3 wherein the wireless technology comprises Bluetooth® wireless communication technology.

5. The apparatus of claim 3 wherein the wireless communication comprises WIFI.

6. The apparatus of claim 1 wherein the local communication comprises a hardwired link.

7. The apparatus of claim 6 wherein the hardwired link comprises an Ethernet connection.

8. The apparatus of claim 1 wherein the local relay is configured to communicate with an intermediary remote location.

9. The apparatus of claim 8 wherein the intermediary remote location comprises a cellular telephone tower.

10. The apparatus of claim 1 wherein the battery tester address information comprises an IP address.

11. The apparatus of claim 1 wherein the battery tester address comprises an address in accordance with cellular telephone communication protocols.

12. The apparatus of claim 1 wherein the remote communication link is in accordance with cellular telephone communication protocol.

13. The apparatus of claim 1 wherein the local communication link is bi-directional.

14. The apparatus of claim 13 wherein the battery tester retrieves test parameter updates from the local relay.

15. The apparatus of claim 13 wherein the battery tester receives software updates from the local relay.

16. The apparatus of claim 13 wherein the battery tester receives service bulletins from the local relay.

17. The apparatus of claim 13 wherein the battery tester receives test procedures from the local relay.

18. The apparatus of claim 13 wherein the battery tester receives battery replacement authorization from the local relay.

19. The apparatus of claim 13 wherein the battery tester receives weather related information from the local relay.

20. The apparatus of claim 13 wherein the battery tester receives information related to the specific battery under test.

21. The apparatus of claim 1 wherein the test circuitry including a Kelvin connection configured to couple the test circuitry to the battery.

22. The apparatus of claim 1 wherein the test circuitry'measures a dynamic parameter of the battery.

23. The apparatus of claim 1 including a user input.

24. The apparatus of claim 23 wherein the battery test data includes data received through the user input.

25. The apparatus of claim 24 wherein the data received through the user input comprises a battery rating.

26. The apparatus of claim 24 wherein the data received through the user input comprises a battery type.

27. The apparatus of claim 1 including a display configured to provide an output related to the condition of the battery.

28. The apparatus of claim 1 wherein the battery test data includes the output related to the condition of the battery.

29. The apparatus of claim 1 wherein the battery test data includes data used by the test circuitry to determine the condition of the battery.

30. The apparatus of claim 1 wherein the battery test data includes data received through a bar code.

31. The apparatus of claim 1 wherein the battery test data includes data which identifies a dealer.

32. The apparatus of claim 1 wherein the battery test data includes a warranty code.

33. The apparatus of claim 1 wherein the battery test data includes count information.

34. The apparatus of claim 1 wherein the battery test data includes information related to a promotion.

35. The apparatus of claim 1 wherein the battery test data includes a compilation of data.

36. The apparatus of claim 1 wherein the battery test data is encrypted.

37. The apparatus of claim 1 wherein the battery test data is transmitted on the local or remote communication link at predetermined times.

38. The apparatus of claim 1 wherein the battery test data is transmitted on the local or remote communication link in response to polling of the battery tester.

39. The apparatus of claim 1 wherein the battery test data includes a vehicle identification number (VIN).

40. The apparatus of claim 1 wherein the battery test data includes data retrieved from a data bus of a vehicle.

41. A method for testing a storage battery with a battery tester, comprising:
coupling the battery tester to the storage battery and providing a battery test output from the battery tester related to a condition of the battery;
a battery tester address associated with the battery tester which identifies the battery tester;
transmitting battery test data formatted with the battery tester address on a local communication link to a local relay; and
transmitting the battery test data from the local relay to a remote location over a remote communication link.

42. The method of claim 41 wherein the local communication link comprises a physical connection.

43. The method of claim 41 wherein the local communication link comprises a non-physical connection.

44. The method of claim 41 wherein the local communication link is in accordance with TCP/IP.

45. The method of claim 41 wherein the battery tester address comprises an IP address.

46. The method of claim 45 wherein the IP address comprises four groups of eight bits each.

47. The method of claim 46 wherein the battery test data includes the user input.

48. The method of claim 47 wherein the user input comprises a battery rating.

49. The method of claim 47 wherein the user input comprises a battery type.

50. The method of claim 41 wherein the battery tester address comprises a unique address.

51. The method of claim 41 wherein the communication link is bi-directional.

52. The method of claim 41 wherein the coupling comprises coupling with a Kelvin connection to the battery.

53. The method of claim 41 including measuring a dynamic parameter of the battery.

54. The method of claim 41 including receiving a user input.

55. The method of claim 41 including displaying an output related to the condition of the battery.

56. The method of claim 41 wherein the battery test data includes data used by the test circuitry to determine the condition of the battery.

57. The method of claim 41 wherein the battery test data includes data received through a bar code.

58. The method of claim 41 wherein the battery test data includes data which identifies a dealer.

59. The method of claim 41 wherein the battery test data includes a warranty code.

60. The method of claim 41 wherein the battery test data includes count information.

61. The method of claim 41 wherein the battery test data includes information related to a promotion.

62. The method of claim 41 wherein the battery test data includes a compilation of data.

63. The method of claim 41 including encrypting the battery test data.

64. The method of claim 41 including transmitting battery test data on the communication link at predetermined times.

65. The method of claim 41 wherein the battery test data is transmitted on the communication link in response to polling of the battery tester.

66. The method of claim 41 wherein the battery test data includes a vehicle identification number (VIN).

67. The method of claim 41 including retrieving the battery test data from a data bus of a vehicle.

68. The method of claim 41 including retrieving test parameter updates on the link.

69. The method of claim 41 including receiving software updates on the link.

70. The method of claim 41 including receiving service bulletins on the link.

71. The method of claim 41 including receiving test procedures on the link.

72. The method of claim 41 including receiving battery replacement authorization on the link.

73. The method of claim 41 including receiving weather related information on the link.

74. The method of claim 41 including receiving information related to the specific battery under test on the link.

* * * * *